(12) United States Patent
Ogura

(10) Patent No.: US 6,706,554 B2
(45) Date of Patent: Mar. 16, 2004

(54) CONDUCTOR POSTS, CONSTRUCTION FOR AND METHOD OF FABRICATING SEMICONDUCTOR INTEGRATED CIRCUIT CHIPS USING THE CONDUCTOR POST, AND METHOD OF PROBING SEMICONDUCTOR INTEGRATED CIRCUIT CHIPS

(75) Inventor: Ken Ogura, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 156 days.

(21) Appl. No.: 09/883,363

(22) Filed: Jun. 19, 2001

(65) Prior Publication Data

US 2002/0052065 A1 May 2, 2002

(30) Foreign Application Priority Data

Oct. 26, 2000 (JP) ........................................ 2000-327709

(51) Int. Cl.⁷ .............................................. H01L 21/44
(52) U.S. Cl. ........................ 438/106; 438/107; 438/612
(58) Field of Search ................................. 438/612–618, 438/619, 622, 106, 107

(56) References Cited

U.S. PATENT DOCUMENTS

| 5,000,818 | A | * | 3/1991 | Thomas et al. |
| 5,075,965 | A | * | 12/1991 | Carey et al. |
| 5,791,552 | A | | 8/1998 | Werther .................... 228/248.1 |
| 5,926,731 | A | | 7/1999 | Coapman et al. ........... 438/613 |
| 6,028,357 | A | | 2/2000 | Moriyama et al. .......... 257/737 |
| 6,177,329 | B1 | * | 1/2001 | Pang |
| 6,376,374 | B1 | * | 4/2002 | Stevens |
| 2002/0121692 | A1 | * | 9/2002 | Lee et al. |

FOREIGN PATENT DOCUMENTS

JP          10-064953          3/1998

* cited by examiner

*Primary Examiner*—Ha T Nguyen
(74) *Attorney, Agent, or Firm*—Volentine Francos, PLLC

(57) ABSTRACT

A first IC chip having an electrode pad to which a re-wiring layer is not connected and a second IC chip having an electrode pad to which the re-wiring layer is connected are electrically connected to each other via a conductor post formed on the electrode pad on the first IC chip, thereby electrically connecting and integrating the first and second IC chips.

7 Claims, 49 Drawing Sheets re-wiring layer and
re-wiring layer electrode pad attachment terminals

B area of IC board (IC chip)

CONDUCTOR POSTS, CONSTRUCTION FOR AND METHOD OF FABRICATING SEMICONDUCTOR INTEGRATED CIRCUIT CHIPS USING THE CONDUCTOR POST, AND METHOD OF PROBING SEMICONDUCTOR INTEGRATED CIRCUIT CHIPS

BACKGROUND OF THE INVENTION

1. Field of the Invention

The invention relates to a construction for forming conductor posts on each electrode pad of a semiconductor integrated circuit chip (hereinafter referred to as IC chip) and a method of fabricating the same, particularly to a construction for connecting between the IC chips by use of the conductor posts.

2. Description of the Related Art

There have been conventionally required IC chips which performs more complicated functions at higher speed while microfabricated, particularly there has been required a technique for reducing a chip package size while enhancing the performance of bare chips to pursue the microfabrication of the chips. A CSP (chip size package) has been particularly put into importance because it can be mounted on a printed board with dimensions close to a bare chip size, while a high density miniaturized package can be fabricated, and the performance of the chips can be frequently improved.

It is possible to fabricate the CSP by a variety of fabrication methods. However, even if an IC chip such as a CSP and the like is fabricated by either fabricating method, if the connection parts of the IC chip such as a CSP and the like are small, patterning cannot be effected, and electrodes of the IC chip cannot be aligned with the printed board, and the like when the chip is electrically connected to the printed board, and hence the connection parts have to secure the dimensions of certain size. Accordingly, a re-wiring layer or a pad re-layout has to be provided on the IC chip such as a CSP so as to form connection electrodes having dimensions needed for an external printed board.

Concretely, for example, with a method of fabricating a CSP in a chip level typically represented by a μBGA, a TAB tape 124 having an elastomer 120 serving as an elastic body provided with inner leads 122 is fixed to an integrated circuit board 150, then solder balls 126 each serving as an electrode are formed (See FIG. 29A).

With a method of fabricating a CSP in a wafer level which is an assembly technique in a state of wafer, after metal posts 128 and plastic molding are formed, solder balls 126 each serving as an electrode are formed (See FIG. 29B). Further, as shown in FIG. 29C, there is a method of forming a bump 130 by a metal plating instead of solder balls.

Further, with a method of fabricating a CSP in a wafer level, an S-shaped microspring 132 serving as an electrode is formed on the wafer by an Au wire while a wire bonding technique is applied thereto (See FIG. 29D).

With the foregoing methods, as shown in FIG. 29E, the sum of an area B of electrode pads at the periphery of the IC chip and an area of active parts of the IC becomes an area of the IC chips. However, there are following problems in the conventional method of fabricating the IC chips.

First of all, with a method of fabricating the CPS in a chip level as shown in FIG. 29A, the formation of the re-wiring layer electrode pads is needed to use solder balls for connecting between the solder balls and active parts of the IC, but the electrode pads have to require a largeness to some extent because the size of each solder ball is large. As a result, the dimensions of electrode parts of the IC chip are not particularly microfabricated, causing a problem that the IC chip is difficult to be microfabricated as a whole. In addition to that, there is another problem that fabricating steps increase because the formation of the re-wiring layer and re-wiring layer electrode pads are required.

Further, with a method of fabricating the CSP in a wafer level as shown in FIG. 29B, elements having solder balls which are mechanically formed in advance are handled as individual parts, and also the size of each solder ball is large so that each electrode pad requires a largeness to some extent, resulting in the difficulty of microfabrication. In addition to that, since the solder balls directly contact the printed board, when the solder balls are connected to an external printed board, they are prone to be broken owing to mutual stresses. This is the same in the case of application of metal plating (See FIG. 29C).

Still further, with a method of bonding a metal wire that is a so-called microspring as shown in FIG. 29D, it is difficult to microfabricate the chip because the minimum pitch capable of forming the microspring is about 140 μm.

Even with the IC chips fabricated in either method, an area which an in depth probe contacts requires some extent (to the extent of 100 to 60 μm), causing a problem of limits of microfabrication of each electrode pad.

The invention has been made for solving the foregoing problems, and it is an object of the invention to microfabricate each electrode pad, thereby providing an IC chip and a printed board, and a method of fabricating them.

SUMMARY OF THE INVENTION

According to a first aspect of the invention, each conductive metal post is formed on the surface of each electrode pad serving as an input/output terminal of an IC chip. Since the metal post is directly formed on each electrode pad without intervening a re-wiring layer therebetween, it is not necessary to form the re-wiring layer when the electrode pad is formed. Accordingly, it is not necessary to consider the size of the re-wiring layer, thereby microfabricating the electrode pad to eventually microfabricate the IC chip as a whole. Further, since the electrode pads are microfabricated, if they are disposed on the active parts of the IC, they do not interfere with the IC, and hence the electrode pad can be also disposed on the active parts of the IC. Accordingly, the IC chip can be microfabricated. Meanwhile, the metal post can be formed directly on the IC chip without intervening the electrode pad therebetween as the case may be.

The metal post can be formed using an IC technique such as a photolithography, etching, and the like. The metal post need not be made of one metallic material but may be made of a plurality of metallic materials in a lamination. Further, a solder bump can be provided on the tip end of the metal post, and the solder bump may be formed utilizing an IC technique such as photolithography, etching, and the like, and also may be formed by dipping the metal post in a solder bath, or a plating bath and the like.

According to a second aspect of the invention, with the foregoing IC chip, the tip end of the metal post is formed in a configuration wherein a capillary phenomenon occurs relative to a molten electric connection material.

For the configuration in which the capillary phenomenon occurs, it is formed by rendering the tip end of the metal post, for example, to be in irregularities, or concave or convex. As a result, when the tip end of the metal post is dipped in, for example, a solder bath or a plating bath, molten solder or plating liquid enters concaves of the irregularities, and hence surface tension occurs to solder or plating liquid therearound. Accordingly, the solder bump can be easily formed at the tip end of the metal post.

DETAILED DESCRIPTION OF THE INVENTION

First Embodiment

Figure 1A:
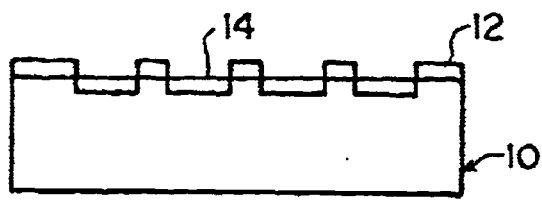
FIGS. 1A–1K are views for explaining fabricating steps according to a first embodiment of the invention.

The first embodiment of the invention is now described hereinafter.

A semiconductor integrated circuit chip 10 (hereinafter referred to as "IC chip") has an electrode pad 14 serving as an input/output terminal relative to a printed board and a metal post 25 formed directly on the electrode pad 14 perpendicularly to the surface of the electrode pad 14. The metal post 25 comprises a first metal layer 22 having conductivity and a second metal layer 26 made of a solder material. Accordingly, the metal post 25 is rendered conductive with the electrode pad 14 and the second metal layer 26 at the tip end thereof serves as a solder bump.

A method of fabricating the IC chip is now described hereinafter.

Figure 1B:
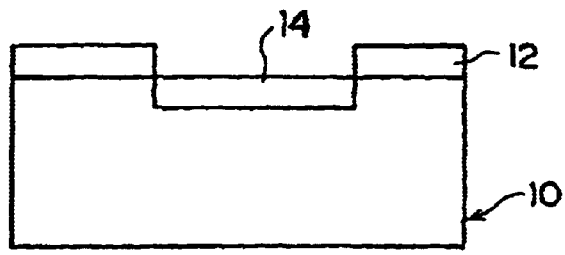

FIG. 1A and FIG. 1B show the IC chip 10 on which a first insulating layer 12 and the electrode pad 14 are laminated. The first insulating layer 12 is formed of a silicon oxide film, silicon nitride film, and the like and it has the construction having a single layer or composite film layers, but it is not limited to such construction. The electrode pad 14 is formed of metals such as aluminum, titanium, tungsten, molybdenum, gold, silver, nickel, indium, or mixed metals thereof or composite film layers, and the like. With the first embodiment, since the solder balls are not used, it is not necessary to consider the size of the solder balls when forming the electrode pad 14. Accordingly, the dimensions of the electrode pad 14 need not be not less than 60 $\mu$m and it can be microfabricated to the minimum dimensions which is a so-called critical design dimensions for the normal IC chip. That is, the dimensions of the electrode pad 14 can be reduced to not more than 60 $\mu$m, and in the range of several $\mu$m to sub $\mu$m or not more than sub $\mu$m.

Figure 1C:
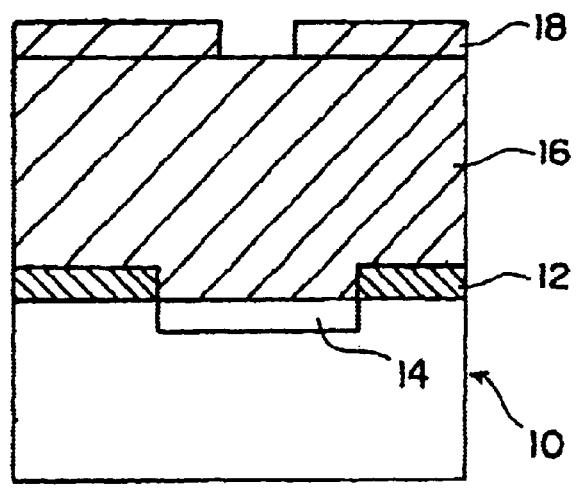

As shown in FIG. 1C, a second insulating layer 16 is further formed on the electrode pad 14 of the IC chip 10. Although the second insulating layer 16 is not particularly limited to a specific material, but it is formed of a resin such as a polyimide film or inorganic material film such a silicon oxide film. Further, the thickness of the electrode pad 14 is not limited to a specific value and the electrode pad 14 may be formed in the thickness ranging from 3 $\mu$m to 100 $\mu$m.

Figure 1D:
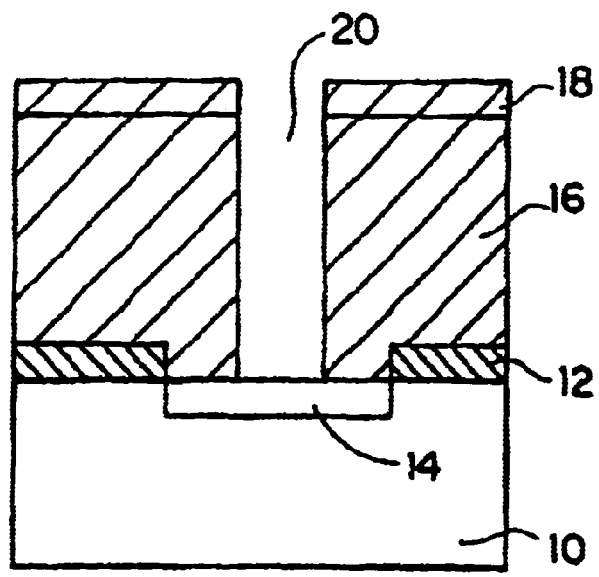

Then, as shown in FIG. 1D, a resist pattern 18 is formed on the second insulating layer 16, and the second insulating layer 16 is etched while the resist pattern 18 serves as a mask, thereby defining an opening 20. The dimensions of the opening 20 is not limited to a specific value but it is preferable to range normally from 1 $\mu$m to 100 $\mu$m. When a photosensitive polyimide or photosensitive resist (photoresist) is used as the second insulating layer 16, the resist pattern 18 is dispensed with and the photosensitive polyimide or photosensitive resist serves as the second insulating layer 16 or the resist pattern 18, so that the steps become simplified.

Figure 1E:
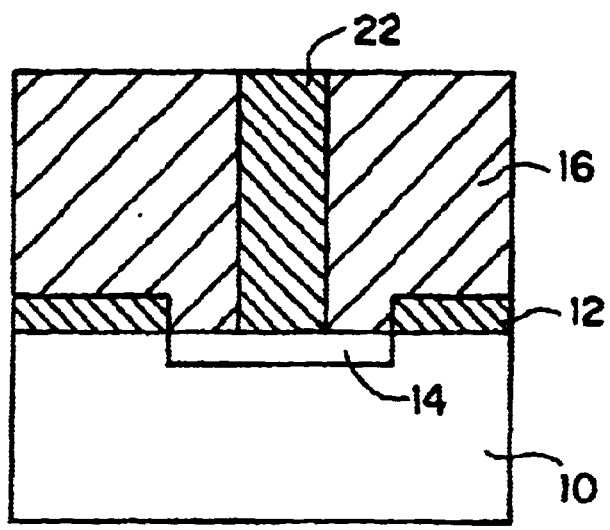

Then, as shown in FIG. 1E, the first metal layer 22 is embedded in the opening 20 defined in the second insulating layer 16 on the IC chip 10. The first metal layer 22 is formed of a material having conductivity, for example, a composite film or mixed metals comprised of at least one or more of aluminum, titanium, tungsten, molybdenum, gold, silver, nickel, indium, or a semiconductor such as silicon to which a high density impurity material is added.

Figure 1F:
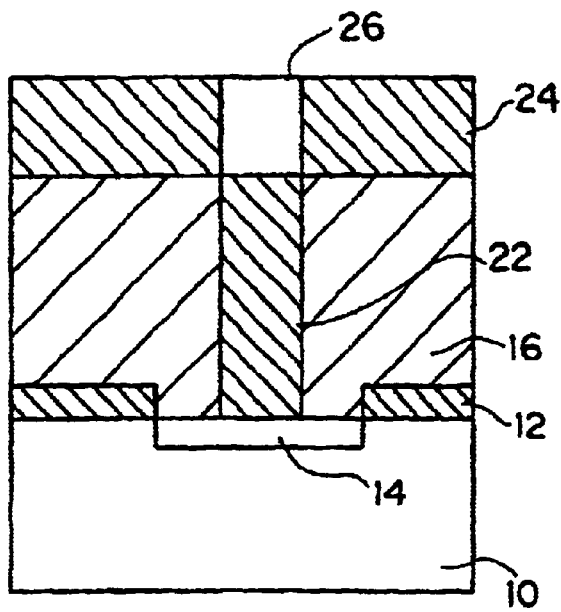

Further, as shown in FIG. 1F, a third insulating layer 24 is formed on the IC chip 10. In the same manner as shown in FIG. 1E, a resist pattern (not shown) is also formed on the third insulating layer 24 and etching treatment is effected while the resist pattern serves as a mask, thereby defining an opening (not shown). The second metal layer 26 formed of a solder material is filled in the opening.

Figure 1G:
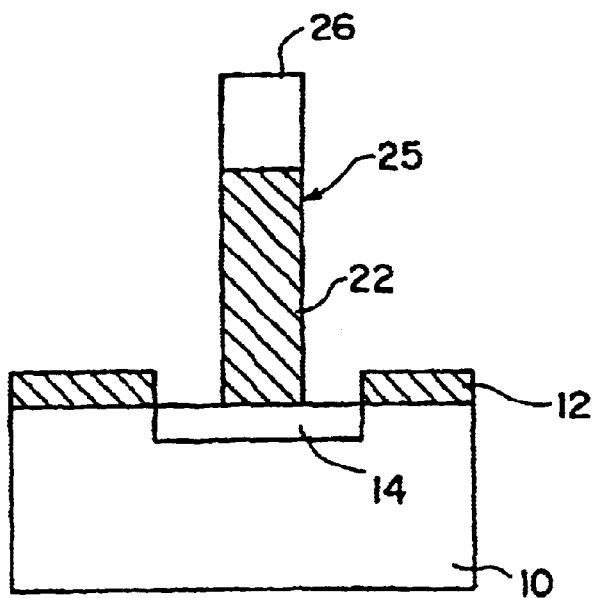

Subsequently, as shown in FIG. 1G, the second insulating layer 16 and the third insulating layer 24 on the IC chip 10 are removed. As a result, the metal post 25 comprising the first metal layer 22 and the second metal layer 26 is formed. Although the first metal layer 22 and the second metal layer 26 are formed in the opening defined by the second insulating layer 16 and the third insulating layer 24, it is possible to form the first metal layer 22 and the second metal layer 26 at the same time only by the opening defined by the second insulating layer 16. That is, the first metal layer 22 is deposited halfway in the opening 20 of the second insulating layer 16 shown in FIG. 1D, then the second metal layer 26 is deposited in the opening, thereby dispensing with the third insulating layer 24.

Figure 1H:
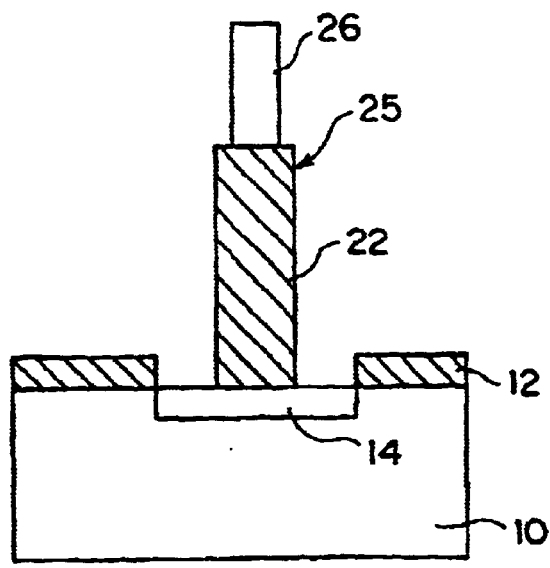
Figure 1I:
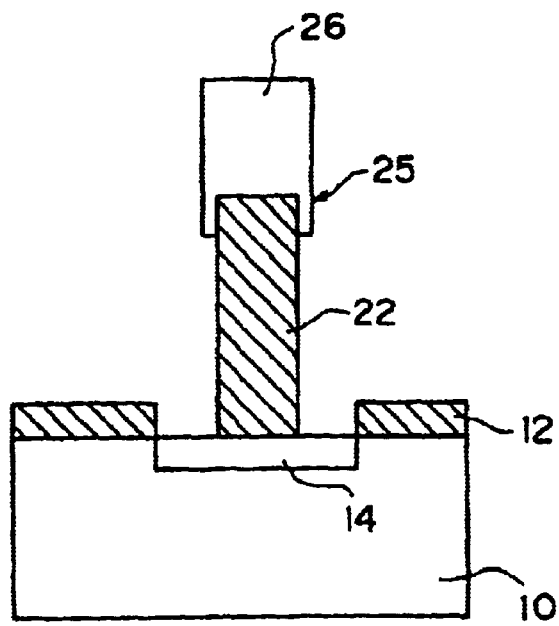
Figure 1J:
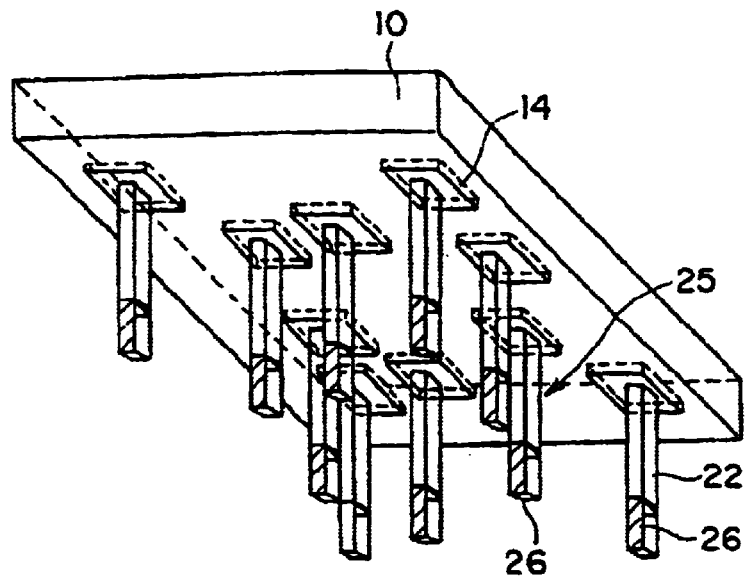

As mentioned above, the metal post 25 comprising the first metal layer 22 and the second metal layer 26 is formed on the electrode pad 14 of the IC chip 10. As shown in FIG. 1H, the second metal layer 26 can be also formed in the same manner even if the dimensions of the width of the second metal layer 26 are smaller those of the first metal layer 22. Further, as shown in FIG. 1I, the second metal layer 26 can be formed in the same manner so as to be larger than the first metal layer 22 in width, and to cover the first metal layer 22. Since the second metal layer 26 thus fabricated in this manner is made of a solder material, it can be jointed to an adjacent metal body when heated and can be electrically connected to the adjacent metal body. The perspective view of the IC chip 10 shown in FIG. 1G is shown in FIG. 1J.

Figure 1K:
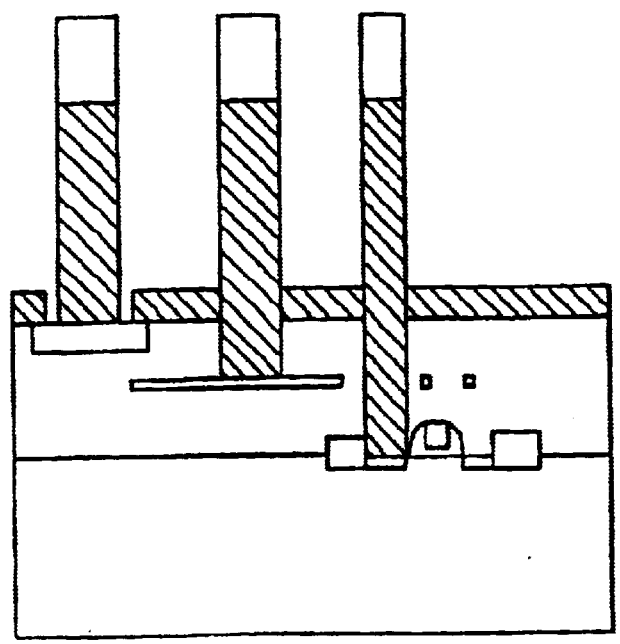

Meanwhile, according to the first embodiment of the invention, the metal post 25 comprising the first metal layer 22 and second metal layer 26 is formed on the electrode pad 14 which is formed on the IC chip 10, but it can be formed directly on a needed output terminal of the IC chip 10 without forming the electrode pad 14 as shown in FIG. 1K. Further, the metal post 25 may be formed, for example, on a terminal of a transistor 28 or may be formed on a wiring layer 30.

Figure 2A:
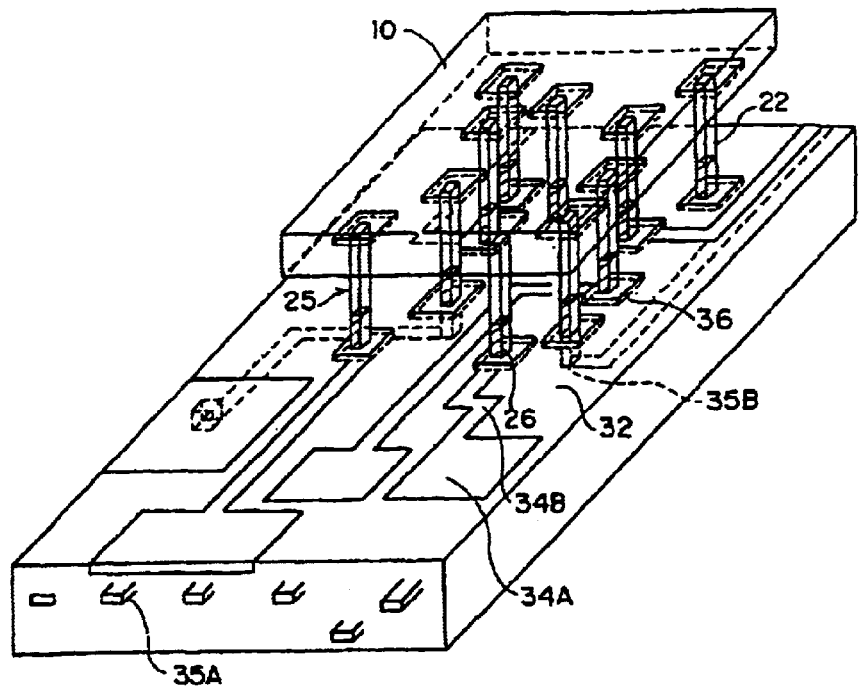
FIGS. 2A–2B are view for explaining a case where a semiconductor IC board fabricated according to the first embodiment of the invention is connected to an external printed board.
Figure 2B:
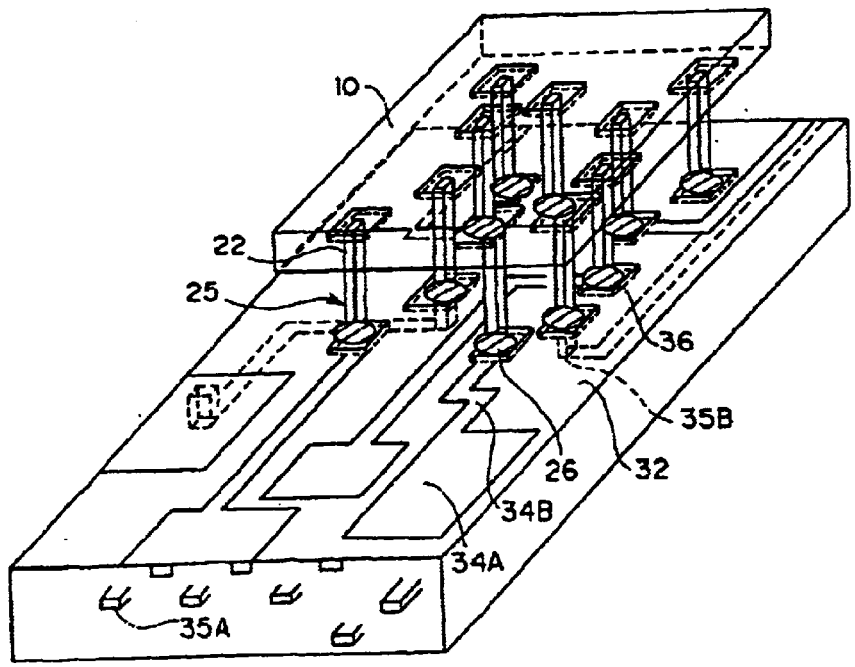

As shown in FIG. 2A and FIG. 2B, the IC chip 10 constitutes a semiconductor IC board in a state to be connected to a printed board 32.

Described hereinafter is a case where the IC chip 10 shown in FIG. 1G is connected to the printed board 32 to fabricate the semiconductor IC board. As shown in FIG. 2A, a metal wiring 34 comprising a re-wiring layer wiring 34A and a re-wiring layer electrode 34B is formed on the printed board 32. The metal wiring 34 can be connected to other circuit by the re-wiring layer electrode 34B. Further, the metal wiring 34 can be formed not only on the surface of the printed board 32 but also formed inside the printed board 32 (multiplayer wiring 35A), or through the printed board 32 (through conducting wire 35B) or on the back surface of the printed board 32.

Each electrode pad 36 serving as a wiring pattern is formed on the printed board 32. The layout dimensions of each electrode pad 36 formed on the printed board 32 has to be the same as the layout dimension and the construction (interelectrode pitch) of the electrode pad 14 formed on the IC chip 10. It is needless to say that dimensions of the electrode pad 36 formed on the printed board 32 may be larger than or smaller than those of the electrode pad 14. According to the first embodiment, the dimensions of the electrode pad 36 are the same as those of the electrode pad 14 formed on the IC chip 10 as shown in FIG. 1A to FIG. 1G. Particularly, the dimensions are not limited to specific values but they range from 1 μm to 100 μm.

Each second metal layer 26 formed on the IC chip 10 over the printed board 32 is disposed corresponding to each electrode pad 36 formed on the printed board 32. Then, as shown in FIG. 2B, when the second metal layer 26 is heated, it is softened and molten. Since the second metal layer 26 is made of a solder material, when it is softened and molten, it connects between the electrode pad 14, the first metal layer 22 and the electrode pad 36 via the first metal layer 22. A solder material serving as the second metal layer 26 is formed on the IC chip 10 and also on the electrode pad 36 on the printed board 32, so that the solder material of the IC chip 10 and that of the printed board 32 are heated and softened, thereby securing the connection therebetween.

Figure 3A:
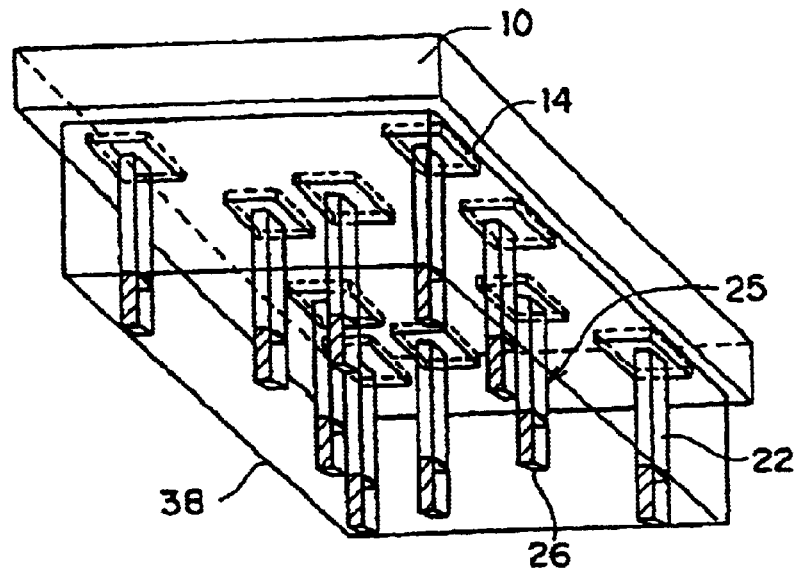
FIGS. 3A–3B are views for explaining a case where the semiconductor IC board fabricated according to the first embodiment of the invention is filled with an insulating material.

For a peripheral construction of the metal post 25 of the IC chip 10, a filling insulating material body 38 is formed in a space where each metal post 25 is formed as shown in FIG. 3A. When the filling insulating material body 38 is formed, the metal post 25 is protected from an external force and the like, and the side surface of the filling insulating material body 38 serves as a guide for aligning with the side surface of the IC chip 10. The filling level of the filling insulating material body 38 is up to the height of the first metal layer 22 or second metal layer 26. However, the tip end of the second metal layer 26 has to be exposed to the surface of the filling insulating material body 38.

Figure 3B:
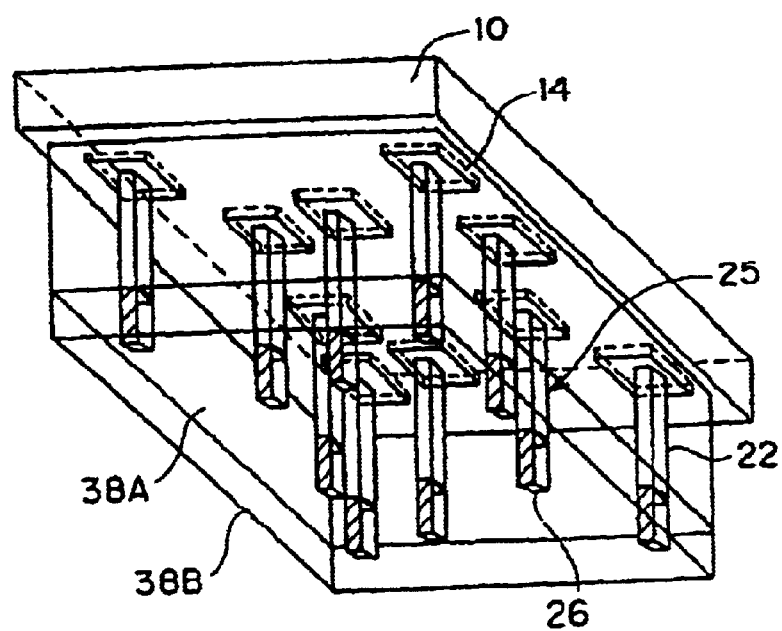

As a method of filling the filling insulating material body 38, as shown in FIG. 3B, it may comprise a first filling insulating material body 38A and a second filling insulating material body 38B. In this case, the first filling insulating material body 38A is filled up to the height of the first metal layer 22 and the second filling insulating material body 38B is filled up to the height of the second metal layer 26. For the method of forming the filling insulating material bodies 38A and 38B, the insulating layers 16, 24 when the metal post 25 is formed are held as they are. The surface of the filling insulating material body 38 becomes planet when it is formed by an IC forming technique such as photolithography but it becomes more planet when it is formed by a CSP technique and the like.

Further, after the insulating layers 16, 24 when the metal post 25 is formed are removed, the filling insulating material body 38 may be filled anew. As shown in FIG. 3A and FIG. 3B, the formation of an external configuration of the filling insulating material body 38 is effected by the IC forming technique such as photolithography to serve as a guide for the alignment between the filling insulating material body 38 and the IC chip 10.

The reason why the filling insulating material body 38 has a double layer construction is that after alignment of the connecting positions between the metal post 25 formed on the IC chip 10 and the electrode pad 36 formed on the printed board 32 when the IC chip 10 is connected to the printed board 32, the second filling insulating material body 38B is removed while the first filling insulating material body 38A remains as it is so as to soften and melt the solder material.

Figure 4:
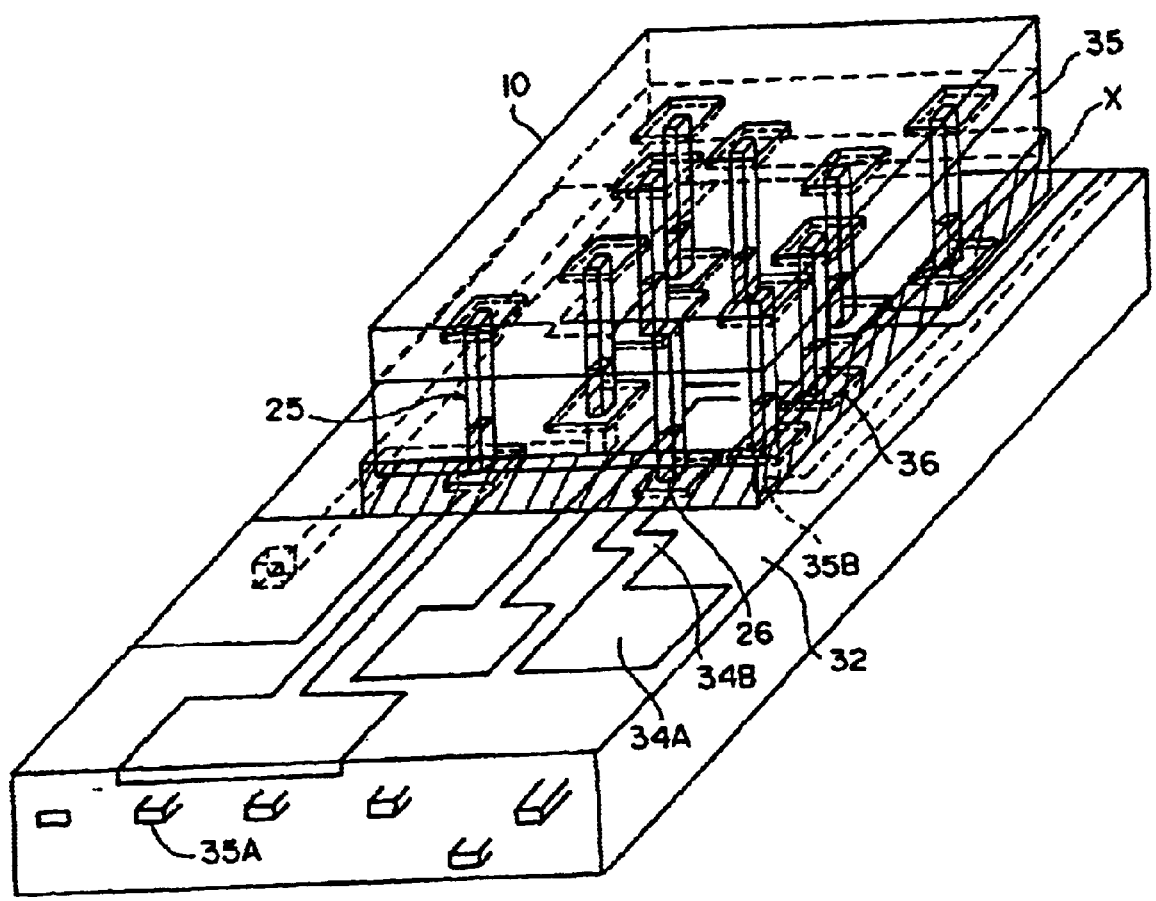
FIG. 4 is a view for explaining a case where a guide mark is attached to the semiconductor IC board fabricated according to the first embodiment of the invention.

FIG. 4 is a perspective view where the IC chip 10 is installed on the printed board 32. A guide mark X is formed on the printed board 32. The guide mark X is formed for aligning the metal post 25 formed on the IC chip 10 with the electrode pad 36 formed on the printed board 32 and also aligning with the first filling insulating material body 38A and the second filling insulating material body 38B formed on the IC chip 10. The guide mark X is formed on every IC chips 10 installed on the printed board 32.

Figure 5A:
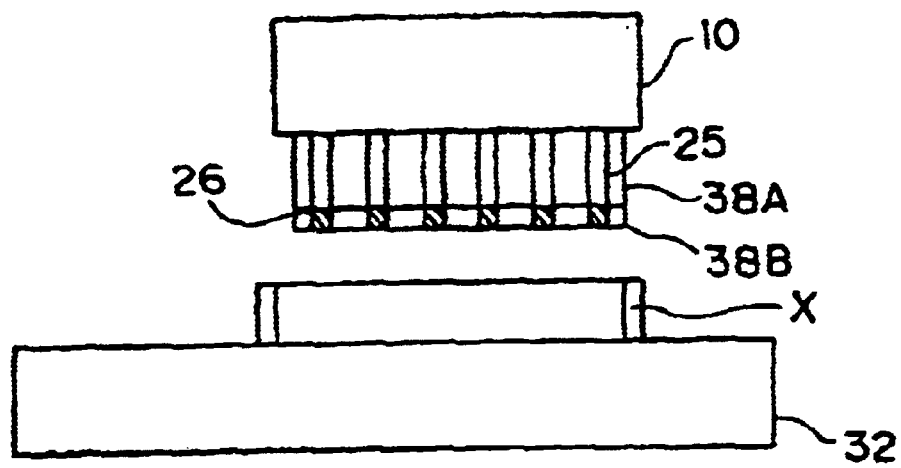
FIGS. 5A–5B are views for explaining side views in FIG. 8.
Figure 5B:
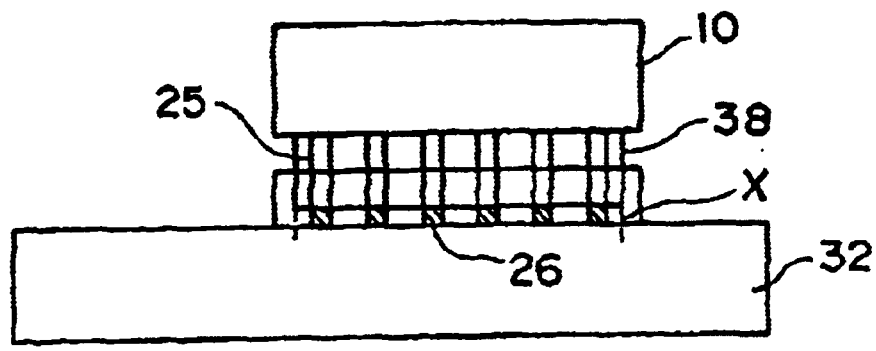

There are a variety of shaped for the guide mark X, and hence the shape of the guide mark X is not limited to a rectangular shape as illustrated in the first embodiment. Further, the guide mark X is not limited to a planar shape but may be formed of a three-dimensional shape as shown in FIG. 5A and FIG. 5B. The guide mark X may be formed of a shape projecting upward (wall panel shape), or a spot facing (groove) as a whole in which a part of the IC chip 10 is completely inserted. That is, an alignment mark is formed every IC chip 10 mounted on the printed board 32 and it is aligned with a alignment mark formed on the IC chip 10, so that the electrodes thereof are connected to each other.

According to the first embodiment of the invention, the IC chip 10 and the printed board 32 can be connected to each other without forming the re-wiring layer on the IC chip 10. That is, the electrode pad 14 is formed on the IC chip 10 without forming the re-wiring layer, and the first metal layer 22 is formed on the electrode pad 14, then the second metal layer 26 made of a solder material is formed on the tip end of the first metal layer 22.

Accordingly, only the patterns on the IC chip 10 controls the minimum dimensions, thereby microfabricating the electrode pad. Further, since the solder bump is integrally formed with the IC chip 10, the handling of the solder balls is dispensed with, thereby improving the stability of the connection. Still further, when the solder bump (second metal layer 26) having the same function as the solder balls are formed integrally with the wafer without using the solder balls in a state where the IC chip 10 is a wafer, a small sized solder bump can be formed comparing with a case of using the solder balls. Still further, since the electrode pas electrode pad 14 is microfabricated, the electrode pad 14 can be disposed on the active part of the IC, and hence the IC chip 10 can be microfabricated as a whole.

Since the electrode pad 36 having the same dimensions and layout construction as those of the electrode pad 14 of the IC chip 10 is formed on the printed board 32 so as to connect to the thus formed IC chip 10, the electrode pad 14 of the IC chip 10 and the electrode pad 36 of the printed board 32 can be easily connected to each other. Further, the metal post 25 formed of the first metal layer 22 and the second metal layer 26 formed respectively on the IC chip 10 can be connected to the electrode pad 36 even if the electrode pad 36 is somewhat deviated from the fixed position because the metal post 25 has an area which is smaller than an area of the electrode pad 36 of the printed board 32 and the tip end of the metal post 25 is formed of the second metal layer 26 made of a solder material.

Further, if the dimensions and layout of the electrode pad 36 is rendered the same as those of the electrode pad 14 of the IC chip 10, the dimensions of the electrode of the IC chip 10 can be reduced, and hence the dimensions of the IC chip 10 can be reduced as a whole, so that the number of IC chips which can be taken out from one piece of wafer can be increased.

In addition to that, since the electrode pad 14 can be disposed on any region of the IC chip 10, the mutual interface of an operation signal in a high frequency can be reduced. Further, as shown in FIG. 1K, if the electrode pad 14 is not formed, the metal post 25 is directly formed on output and input terminal of a signal to form a circuit, so that the length of the wiring can be reduced. As a result, the electronic characteristics in a high frequency can be improved.

Since an area of the electrode pad 14 can be microfabricated, the electrode pad 14 can be disposed inside, so that the reduction of a peripheral area and the reduction of wiring of signal lead lines can be effected, thereby microfabricating the area of the IC.

As shown in FIG. 3A and FIG. 3B, the metal post 25 comprising the first metal layer 22 and the second metal layer 26 can be protected from an external force by the metal post 25 of the IC chip 10 and the first filling insulating material bodies 38A and 38B for filling the gaps of the metal posts 25, which is very effective when connecting the metal post 25 or the second metal layer 26 to the electrode pad 36 of the printed board 32. Further, there is a case that the filling insulating material bodies 38A and 38B serve as an alignment for jointing the metal post 25 formed on the IC chip 10 and the electrode pad 36 formed on the printed board 32.

Figure 6A:
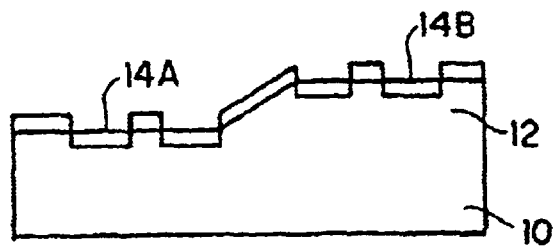
FIGS. 6A–6C are views for explaining a case where heights of metal posts which are fabricated according to the first embodiment of the invention are varied.
Figure 6B:
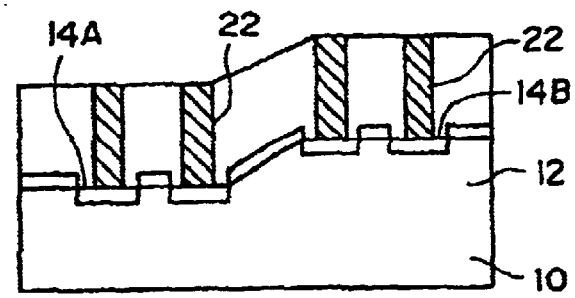

Meanwhile, as is understood from FIG. 1J, the heights of the metal posts 25 comprising the first metal layer 22 and the second metal layer 26 formed on the electrode pads 14 of the IC chip 10 are rendered the same. If the heights of the metal posts 25 are unequal, only the high metal post 25 can contact the electrode pad 36 of the printed board 32 while the low metal post 25 is impeded by the high metal post 25, and hence it does not contact the electrode pad 36. As shown in FIG. 6A, the positions in the direction of the height of the electrode pad 14 formed on the IC chip 10 are normally differentiated depending on the disposition of the IC chip 10. One electrode pad 14A is formed on the lower position while other electrode pad 14B is positioned on the position higher than electrode pad 14A. Other steps are the same as those set forth above, and hence the explanation thereof is omitted. Then, as shown in FIG. 6B, the metal layer 22A formed on the lower position and the metal layer 22B formed on the higher position are differentiated in height by the step therebetween although the thickness thereof are the same.

Figure 6C:
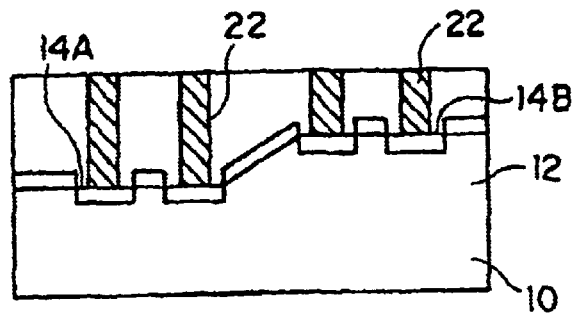

Then, as shown in FIG. 6C, the step on the surface of the IC chip 10 is polished to smooth down the surface. As means for smoothing down the surface, a CMP method or whole surface etching method can be employed. It is indispensable that the heights of the metal layers 22, 26, namely, the heights of the metal posts 25 are aligned with one another to a fixed height so as to be connected to the printed board 32.

Second Embodiment

A second embodiment of the invention is now described hereinafter.

Components of the second embodiment which are the same as those of the first embodiment are depicted by the same reference numerals and the explanation thereof is omitted.

Figure 7A:
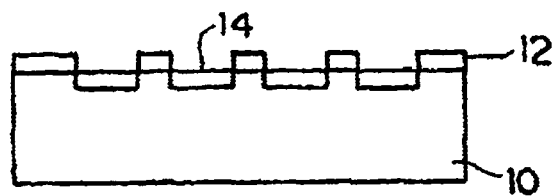
FIGS. 7A–7K and 8A–8D are views for explaining fabricating steps according to a second embodiment of the invention.
Figure 7B:
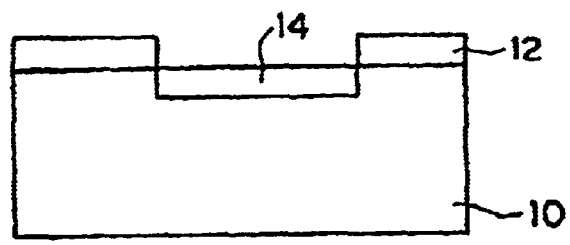
Figure 7C:
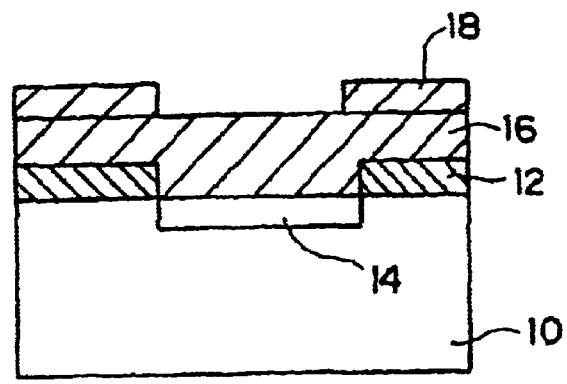
Figure 7D:
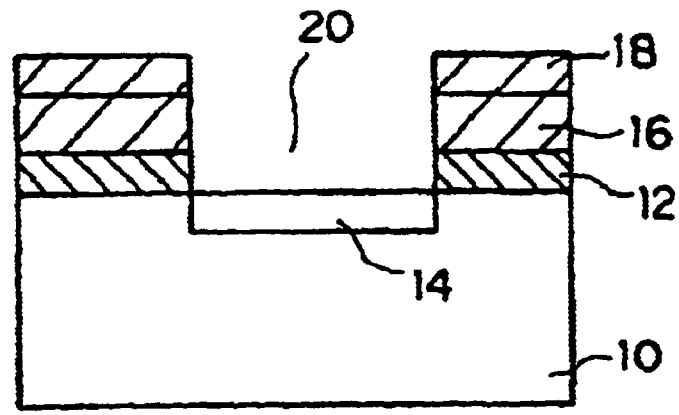
Figure 7E:
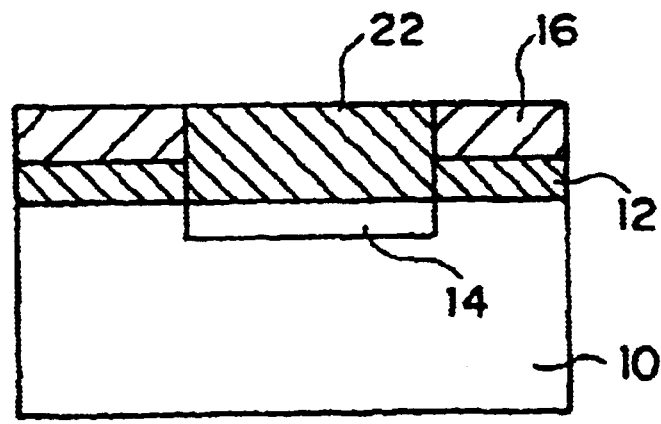
Figure 7F:
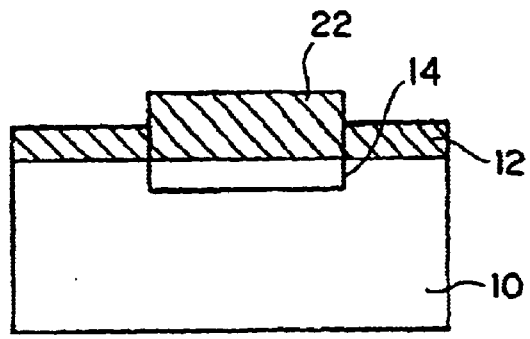
Figure 7G:
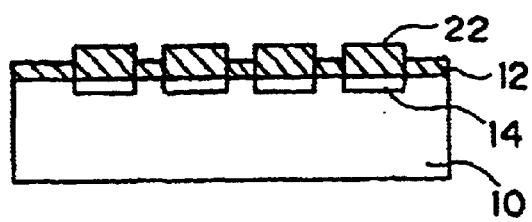
Figure 7H:
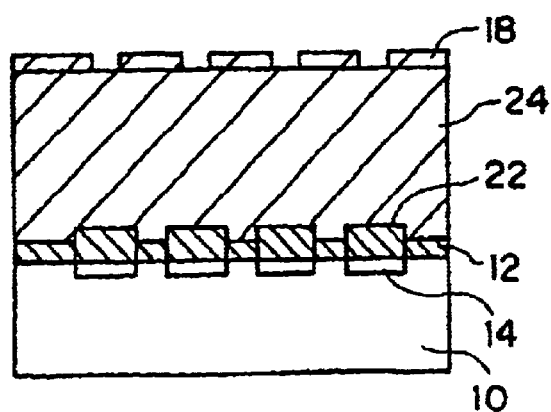
Figure 7I:
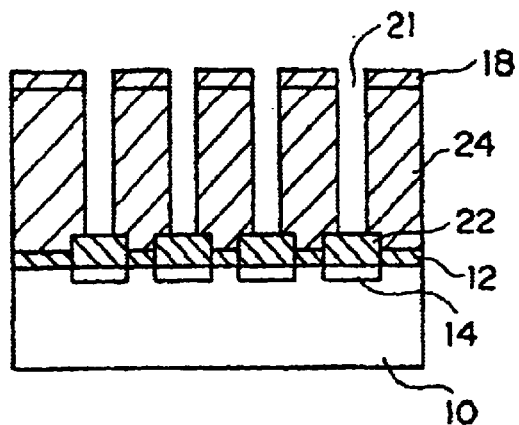
Figure 7J:
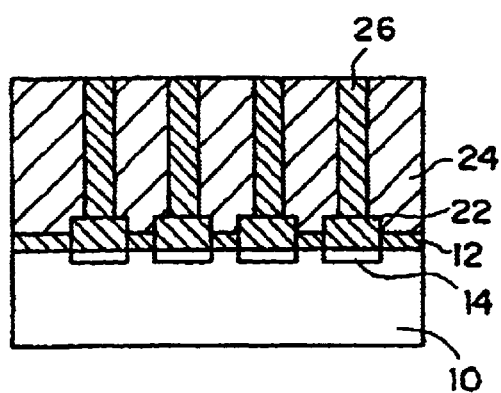
Figure 7K:
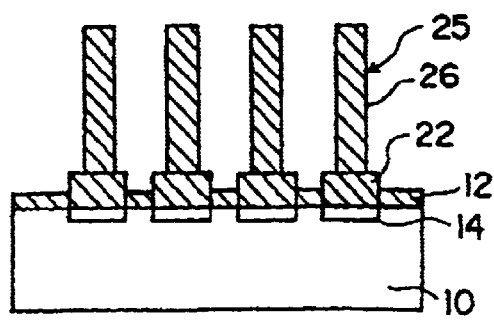
Figure 8A:
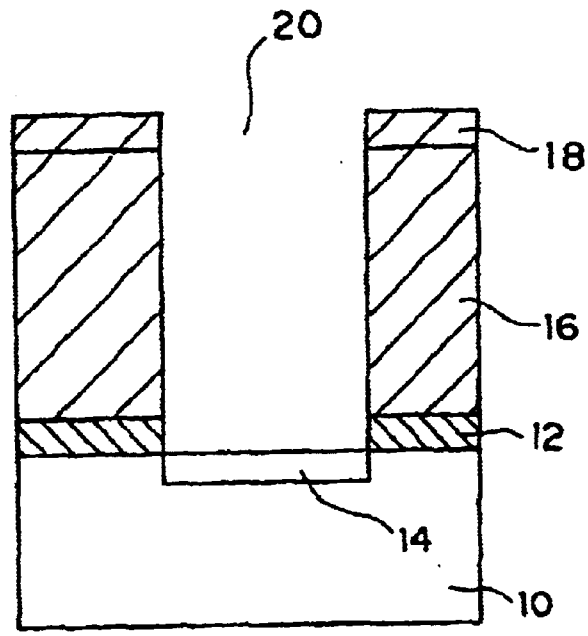
Figure 8B:
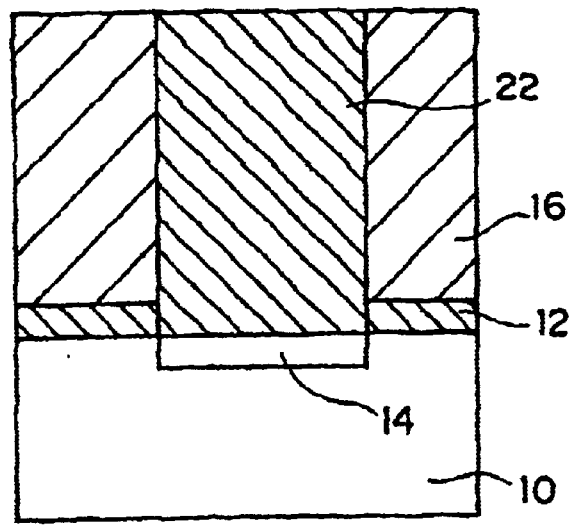
Figure 8C:
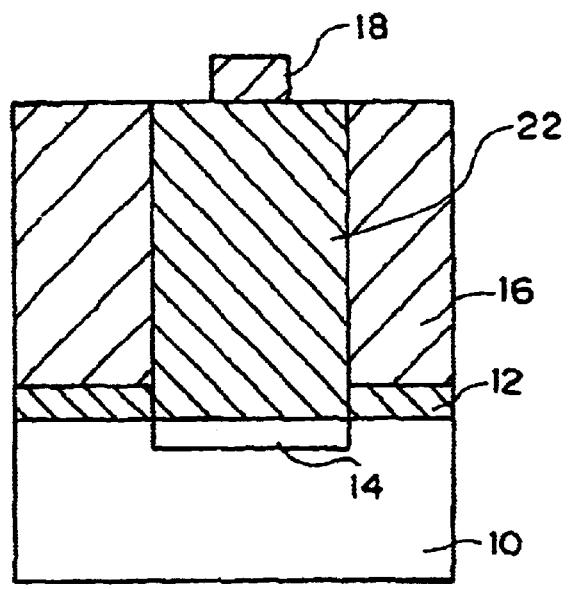
Figure 8D:
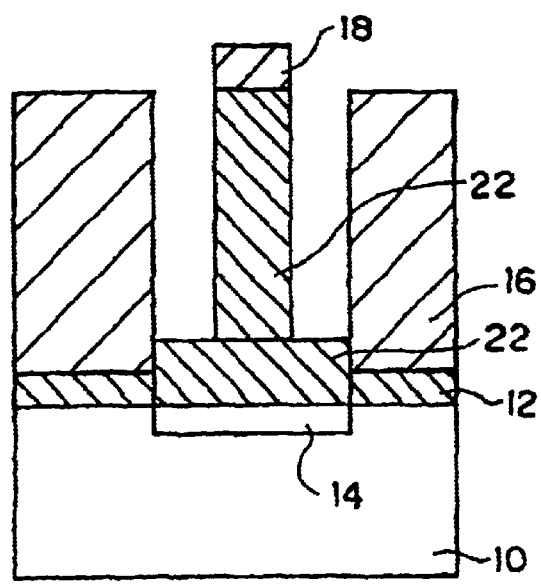

As shown in FIG. 7A to FIG. 7D, an electrode pad 14 and a first insulating layer 12 are formed on an IC chip 10 and a second insulating layer 16, a resist pattern 18, and an opening 20 are formed on the electrode pad 14 and first insulating layer 12 in the same manner as the first embodiment. As shown in FIG. 7E to FIG. 7G, a first metal layer 22 is embedded in the opening 20, and the second insulating layer 16 is etched.

Then, as shown in FIG. 7H to FIG. 7K, a third insulating layer 24 is formed and the resist pattern 18 is formed thereon. The third insulating layer 24 is etched to define an opening 21 while the resist pattern 18 serves as a mask, and a second metal layer 26 is formed on the opening 21. A metal post 25 comprising a first metal layer 22 and a second metal layer 26 is formed by etching the third insulating layer 24. Thereafter, a solder bump is formed on the second metal layer 26 in the same manner as the first embodiment.

As shown in FIG. 8, the metal post 25 can be integrally formed. The first metal layer 22 shown in FIG. 8A is formed in the opening 20 (See FIG. 8B). As shown in FIG. 8C, the resist pattern 18 having an area smaller than the first metal layer 22 is formed on the first metal layer 22. Thereafter, as shown in FIG. 8D, the first metal layer 22 is etched. At this time, the first metal layer 22 is etched while leaving the bottom thereof having a given thickness. As a result, the first metal layer 22 can be formed on the entire surface of the electrode pad 14 of the IC chip 10. Since the bottom of the first metal layer 22 is formed by etching, a part contacting the electrode pad 14 of the first metal layer 22 and the tip end of the first metal layer 22 are integrally formed.

According to the second embodiment of the invention, since the first metal layer 22 is formed on the entire surface of the electrode pad 14 of the IC chip 10 and the second metal layer 26 can be selected considering the bonding characteristics relative to the first metal layer 22, the first metal layer 22 and the second metal layer 26 can be rendered firm in connection strength therebetween. Further, as shown in FIG. 4, since the first metal layer 22 is formed on the entire surface of the electrode pad 14, the first metal layer 22 can be firmly bonded to the electrode pad 14. Still further, when the first metal layer 22 is integrally formed, there is no jointing portion on the first metal layer 22, and hence the connection strength can be more firm.

Third Embodiment

A third embodiment of the invention is now described hereinafter.

Components of the third embodiment which are the same as those of the foregoing embodiments are depicted by the same reference numerals and the explanation thereof is omitted.

As shown in FIG. 9A to FIG. 9D, an electrode pad electrode pad 14 and a first insulating layer 12 are formed on an IC chip 10, and a second insulating layer 16, a resist pattern 18, and an opening 20 are formed on the electrode pad 14 and first insulating layer 12 in the same manner as the first embodiment.

Figure 9A:
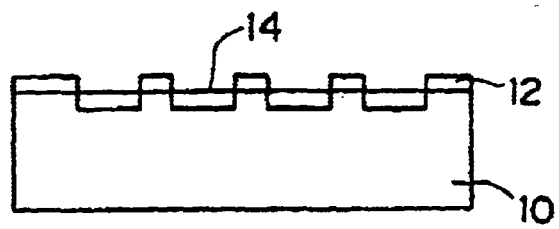
FIGS. 9A–9I are views for explaining fabricating steps according to a third embodiment of the invention.
Figure 9B:
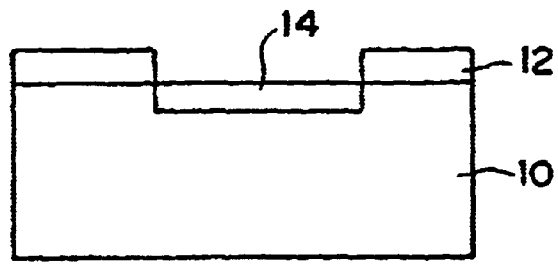
Figure 9C:
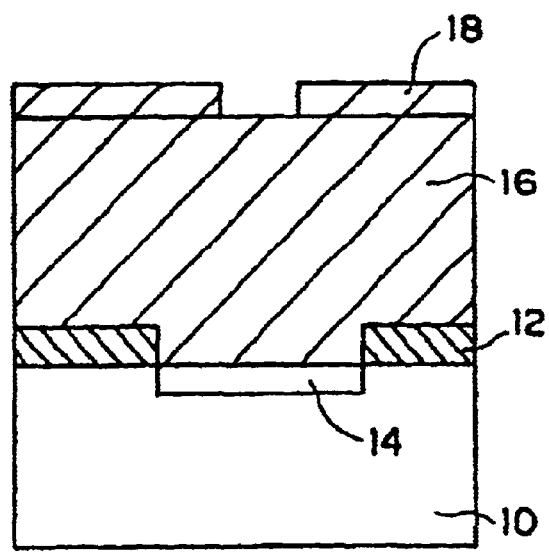
Figure 9D:
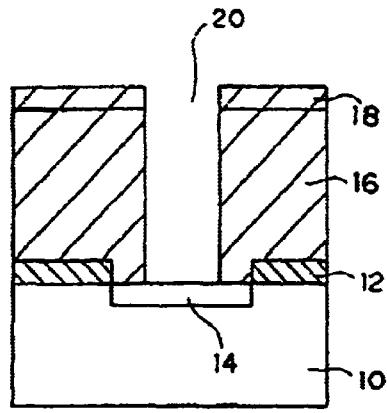
Figure 9E:
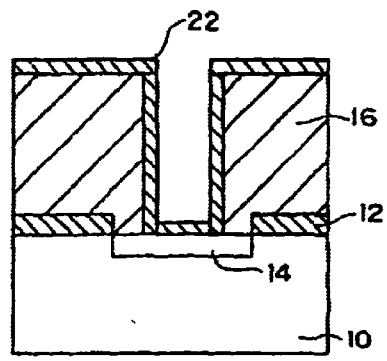
Figure 9F:
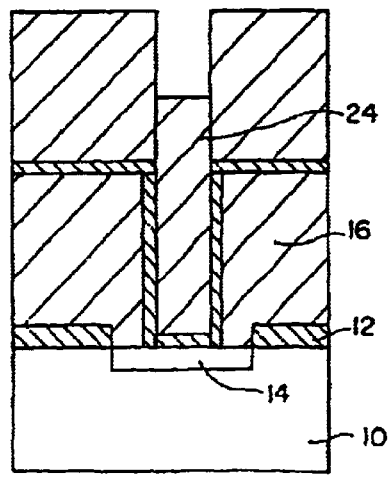

Then, as shown in FIG. 9E, a first metal layer 22 is formed on the surface of the opening 20 over the IC chip 10 and the surface of the second insulating layer 16, and further as shown in FIG. 9F, a third insulating layer 24 is formed on the IC chip 10. The third insulating layer 24 is made of a material such as silicon oxide, silicon nitride, aluminum, polyimide or other insulating materials.

Figure 9G:
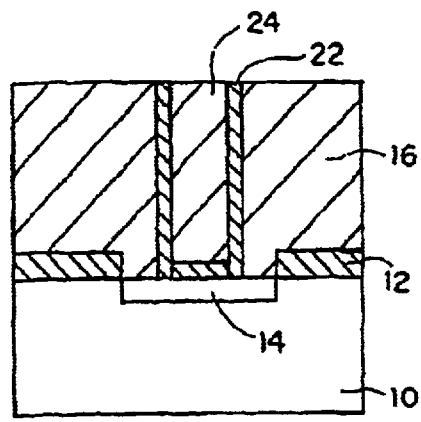
Figure 9H:
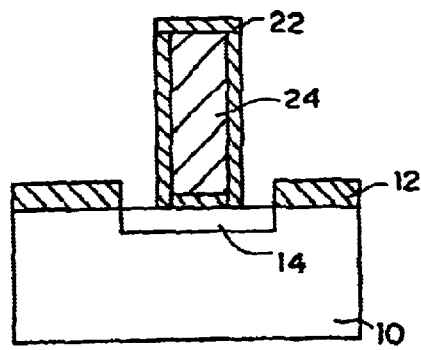
Figure 9I:
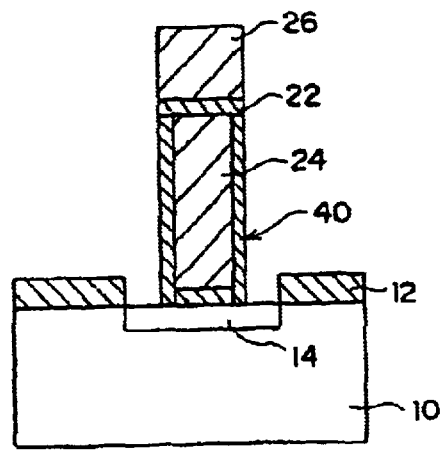

Subsequently, as shown in FIG. 9G, the surface of the IC chip 10 can be polished to be planed. The first metal layer 22 may be formed on the third insulating layer 24 (See FIG. 9H). Then, the second insulating layer 16 is etched and removed. Further, as shown in FIG. 9I, a metal layer 26 made of a solder material is formed on the IC chip 10. As a result, an insulating post 40 covered with the first metal layer 22 serving as a conductive film is formed on the surface of the electrode pad 14. A method of connecting the IC chip 10 to the printed board 32 is the same as that of the first embodiment, and hence the explanation thereof is omitted here.

According to the third embodiment of the invention, since a compound post is formed of the insulating post 40 covered with the first metal layer 22, rigidity of the insulating post 40 increases. As a result, the IC chip 10 and the first metal layer 22 can be connected to each other with stability. Although an insulator is employed inside the IC chip 10, a semiconductor having rigidity may be employed while it is covered with the first metal layer 22.

Fourth Embodiment

Figure 10:
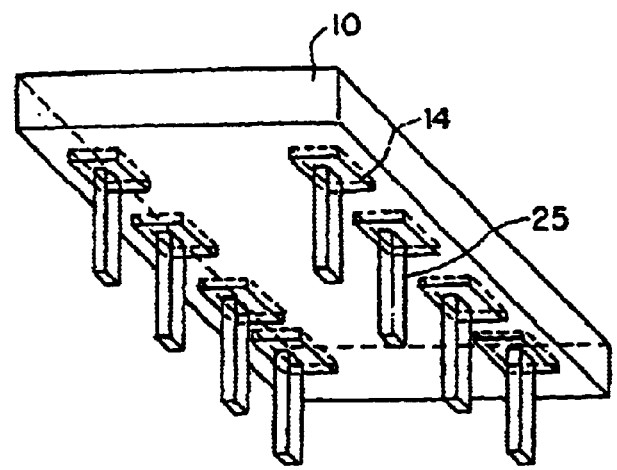
FIGS. 10 and 11 are views for explaining fabricating steps according to a fourth embodiment of the invention.
Figure 10:
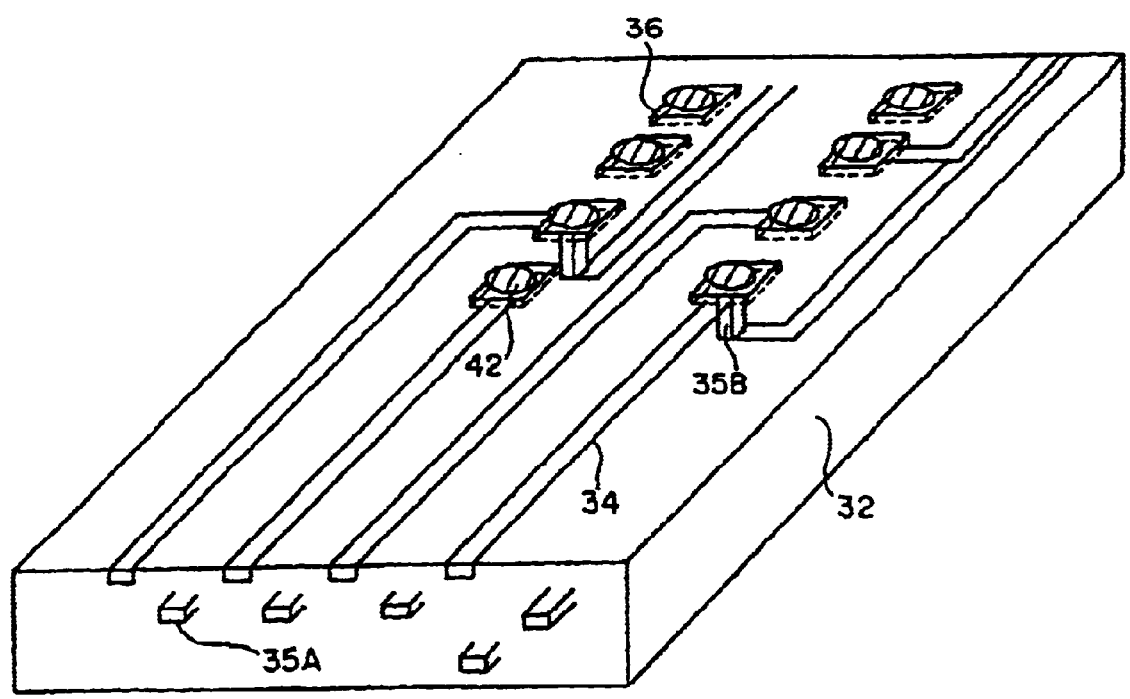

According to a fourth embodiment of the invention, a metal layer 42 made of a solder material is formed on a printed board 32 instead of the second metal layer 26 made of a solder material formed on an IC chip 10 without forming the second metal layer 26 on the IC chip 10, as made in the first, second and third embodiments of the invention. As shown in FIG. 10, a metal layer 42 made of a solder material is formed on an electrode pad 36 of the printed board 32. The metal layer 42 corresponds to the second metal layer 26. A metal post 25 is formed on the electrode pad 14 of the IC chip 10 in the same manner as the first to third embodiments of the invention. The metal post 25 need not be made of a solder material owing to the presence of the metal layer 42.

Figure 11:
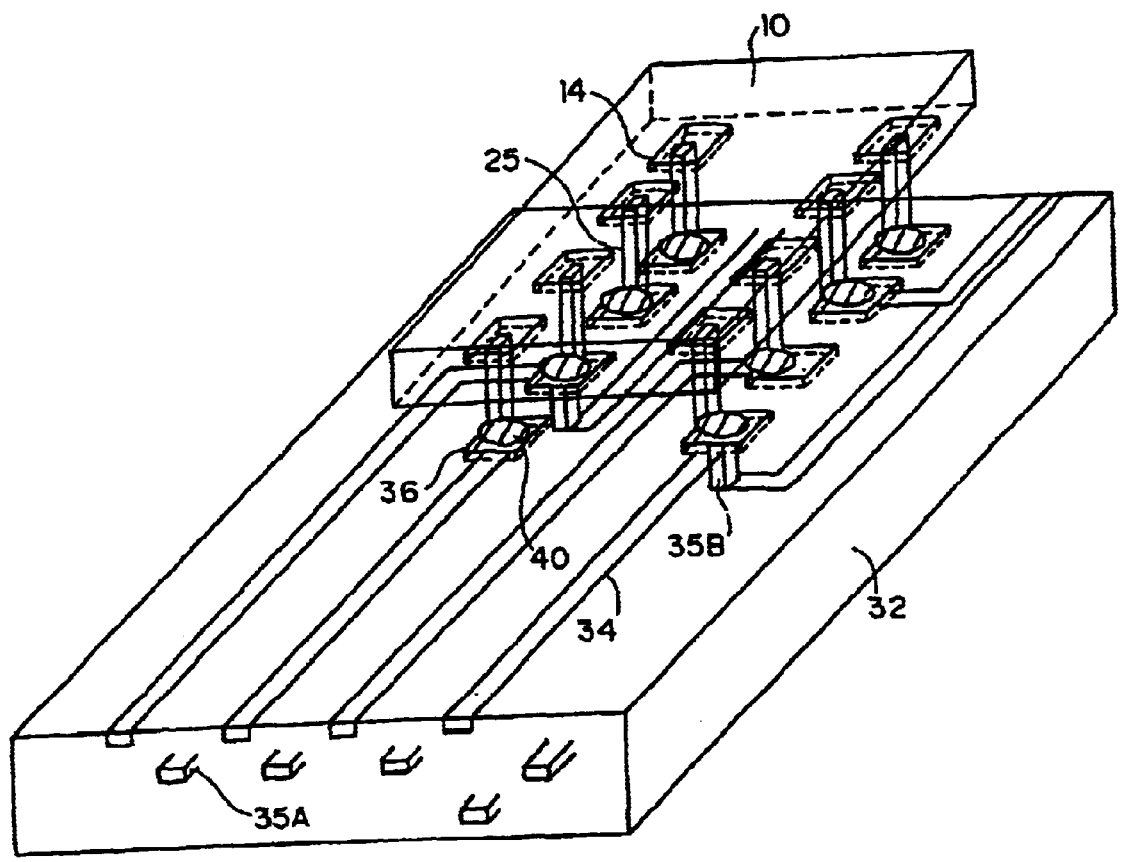

A case where the IC chip 10 is installed on the printed board 32 is explained. As shown in FIG. 11, the metal post 25 formed on the IC chip 10 is installed on the metal layer 42 formed on the printed board 32 in order to install the IC chip 10 on the printed board 32, then the metal layer 42 is heated. Since the metal layer 42 is made of a solder material, it can connect the metal post 25 formed on the IC chip 10 and the electrode pad 14 formed on the printed board 32 when it is heated. Both the IC chip 10 and the printed board 32 may be heated as a whole. In the manner as set forth above, the IC chip 10 and the printed board 32 can be electrically connected to each other.

According to the fourth embodiment of the invention, since the metal layer 42 made of a solder material is formed on the printed board 32, the IC chip 10 can be electrically connected to the printed board 32 without using solder balls. Further, since the metal layer 42 made of a solder material and having a function of solder balls is formed on the side of the printed board 32, an area for covering the metal post 25 by the solder material becomes large, thereby increasing the stability of the connection.

It is possible to form the metal layer 42 made of a solder material on the printed board 32 without forming the second metal layer 26 made of a solder material on the first metal layer 22 of the insulating post 40 using the insulating post 40 as shown in the third embodiment of the invention. As a result, rigidity becomes large by use of the insulating post 40, and also the insulating post 40 made of a solder material are formed on the electrode pad 36 of the printed board 32, so that the IC and the printed board 32 can be connected with stability and assurance.

Fifth Embodiment

According to the first to fourth embodiments of the invention, a metal having solder characteristics, namely, a second metal layer 26 is formed on the tip end of the first metal layer 22 formed on the electrode pad 14. According to a fifth embodiment of the invention, although a metal body having solder characteristics is formed on the first metal layer 22, it is formed by dipping the first metal layer 22 in a solder bath filled with a molten solder liquid or by plating it.

Figure 12A:
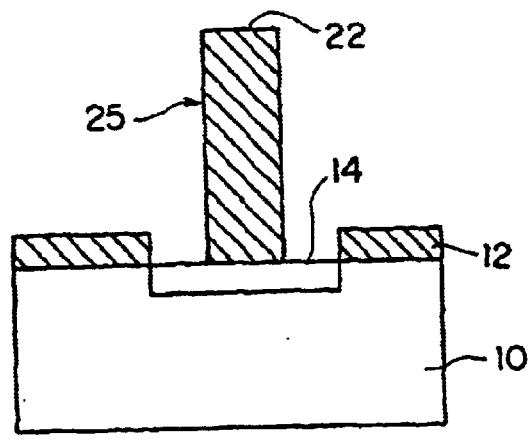
FIGS. 12A–12C, 13A–13C, 14A–14B and 15A–15C are views for explaining fabricating steps according to a fifth embodiment of the invention.

In the same manner as the first embodiment, an electrode pad 14 is formed on an IC chip 10, and a first insulating layer 12, a second insulating layer 16 are formed subsequently, then photolithograph and etching are effected while a resist pattern 18 serves as a mask, thereby defining an opening (See FIG. 1D). Then, as shown in FIG. 12A, a first metal layer 22 is embedded in the opening 20, and the second insulating layer 16 is etched and removed, thereby forming a metal post 25. Although a method of forming the first metal layer 22 is not limited, and it can be formed by use of electrolytic plating, electroless plating, sputtering, deposition, and the like. After the metal post 25 formed of the first metal layer 22 is formed, the surface of the metal post 25 is polished (such as CMP), if need be, to improve the flatness, or smoothness.

Figure 12B:
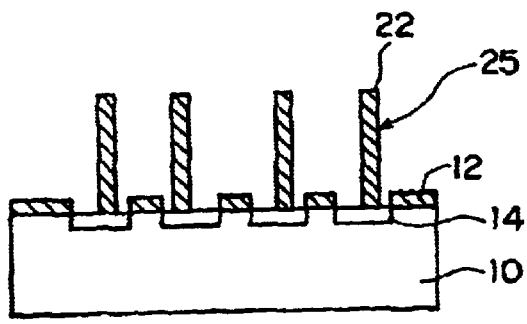
Figure 12C:
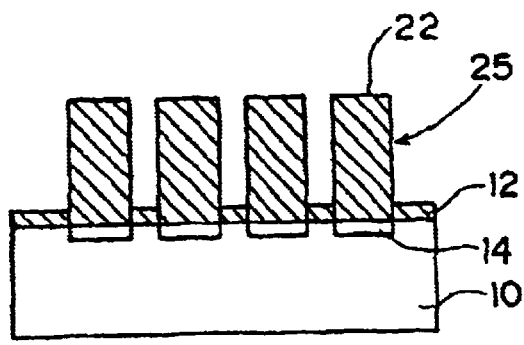

With the foregoing steps, as shown in FIG. 12B, the metal posts 25 formed of only the first metal layer 22 are formed on all the electrode pads 14 of the IC chip 10. Although it is exemplified in FIG. 12A and FIG. 12B, that the dimensions of the metal post 25 is smaller than those of the electrode pad 14, the dimensions of the former may be the same as the latter.

Further, although the height of the metal post 25 is larger than that of the width of the electrode pad 14 of the IC chip 10 according to the fifth embodiment of the invention, if the height of the metal post 25 is larger than the width of the electrode pad 14, the distortion caused by the difference between expansion rate of the IC chip 10 and that of the printed board 32, can be reduced so that the degree of freedom of connection between the IC chip 10 and the printed board 32 can be improved. Further, even if the distortion occurs, if the metal post 25 is higher, it can follow the degree of distortion, thereby connecting the IC chip 10 to the printed board 32. According to the fifth embodiment of the invention, the effect of a case where the height of the metal post 25 which is larger in length than the width of the electrode pad 14 on the IC chip 10 is confirmed.

Figure 13A:
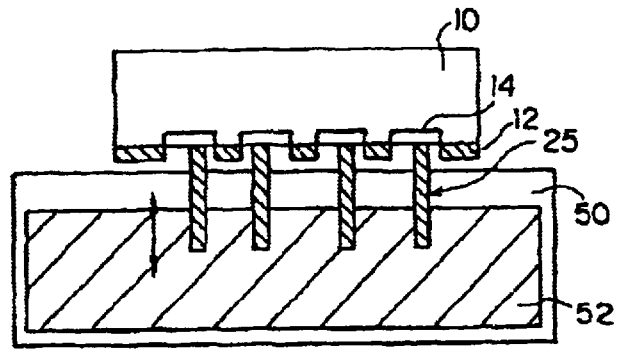
Figure 13B:
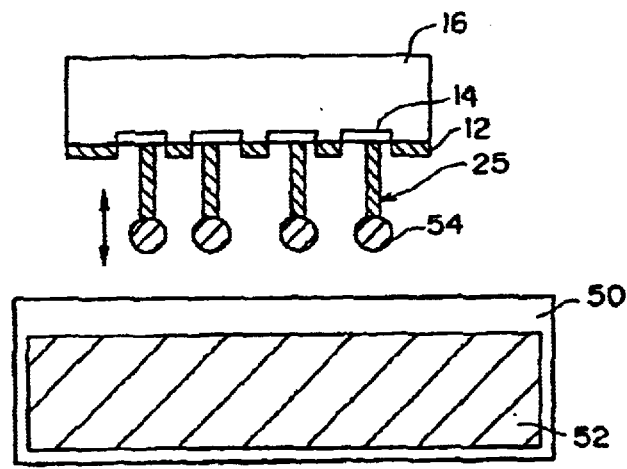
Figure 13C:
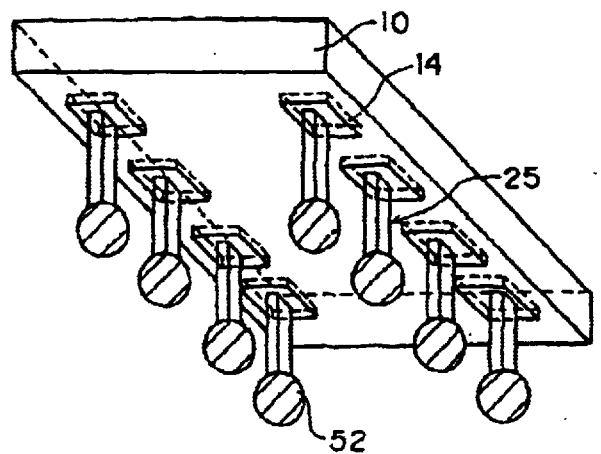

Then, solder flux is attached to the tip end of the metal post 25 (not shown), and the tip end of the metal post 25 of the IC chip 10 is dipped in molten solder 52 in a solder bath 50 as shown in FIG. 13A, to effect plating. As a result, a solder bump 54 is formed on the tip end of the metal post 25 as shown in FIG. 13B, and with the foregoing steps, the IC chip 10 is formed as shown in FIG. 13C.

Figure 14A:
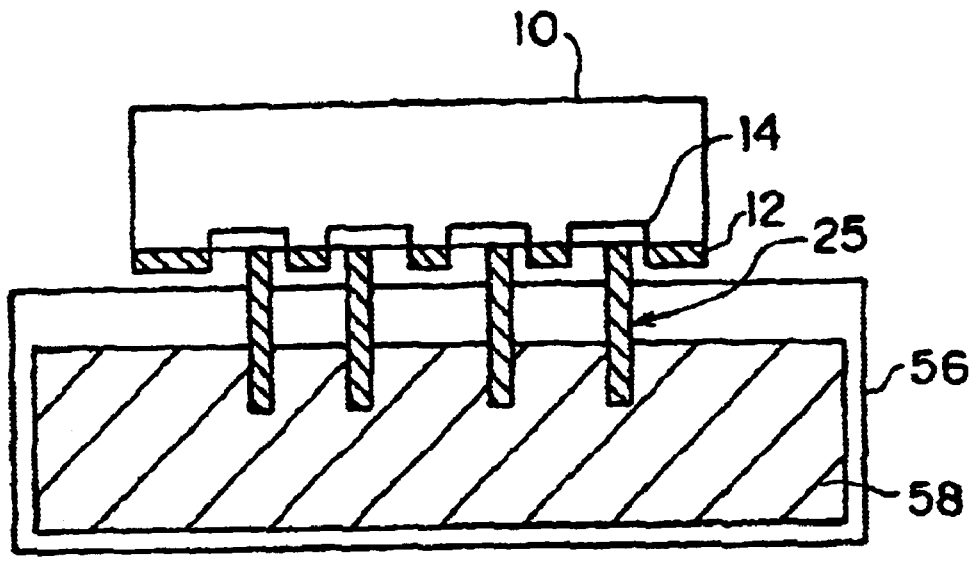
Figure 14B:
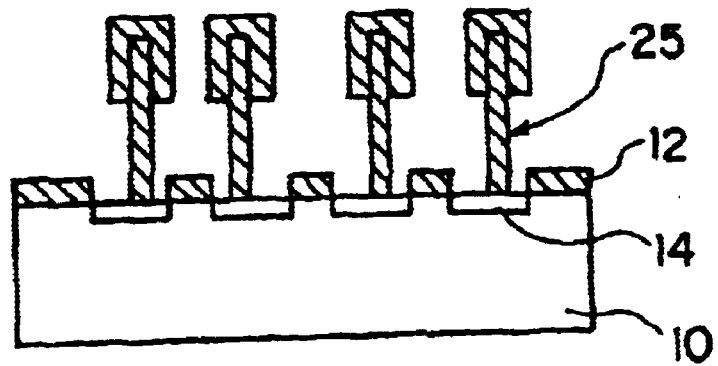

The bath in which the tip end of the metal post 25 is dipped is not limited to the solder bath 50, but a plating bath 56 can be used. In a method using the plating bath 56 as shown in FIG. 14A, when the metal post 25 formed on the IC chip 10 is dipped in a plating liquid 58 of the plating bath 56, the solder bump 54 can be formed on the tip end of the metal post 25.

Figure 15A:
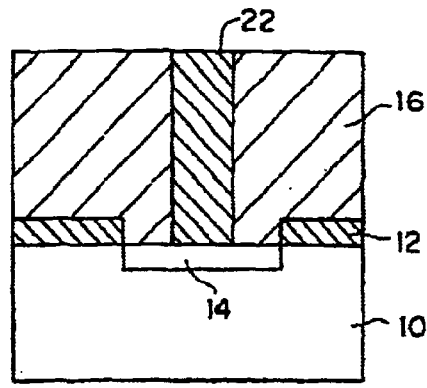
Figure 15B:
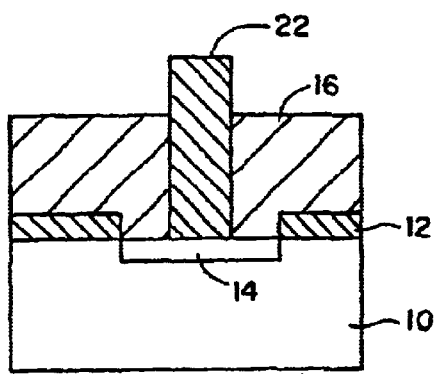
Figure 15C:
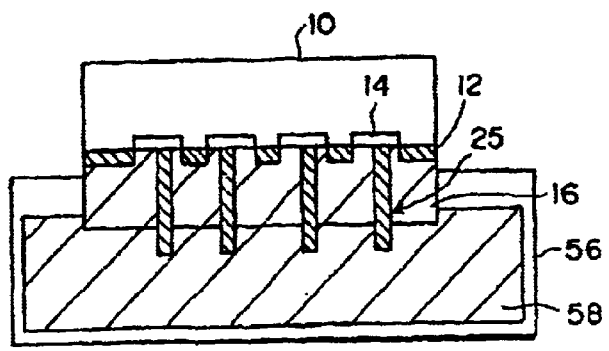

Further, as shown in FIG. 15A to FIG. 15C, in a state where the first metal layer 22 is embedded in the second insulating layer 16, the second insulating layer 16 is etched halfway and removed, thereby exposing the first metal layer 22, i.e. the tip end of the metal post 25, and the tip end of the metal post 25 is dipped in the plating liquid 58 of the plating bath 56, so that the solder bump or other meal layer can be formed on the tip end of the metal post 25. Although, for a plating method, there are electrolyte plating and electroless plating, based on either of which the solder bump or other meal layer can be formed. Further, second insulating layer 16 may be left as it is, depending on the use, or can be removed, depending on an intended use.

According to the fifth embodiment, the metal post 25 is formed on the electrode pad 14 of the IC chip 10 and when the metal post 25 is dipped in the molten solder 52, a solder bump 54 is formed on the tip end of the metal post 25 as a batch processing or steps. Accordingly, since the solder bump 54 is formed integrally with the electrode pad 14, the connection with an external device cab be effected with ease and the assurance of the connection is improved. Further, since the solder bump 54 is formed on the electrode pad 14 via the metal post 25, it is not necessary to form a re-wiring layer.

Further, since the metal post 25 is formed by a photolithographic technique, the width of the metal post 25 can be sufficiently smaller than 100 $\mu$m, thereby innovatively microfabricating the dimensions of the electrode pad 14, leading to the reduction of the dimensions of the IC chip 10. Since the metal post 25 which is longer than the width of the electrode pad 14 of the IC chip 10 is formed on the electrode pad 14, resistance relative to the distortion caused by the heat expansion in the connection between the IC chip 10 and the printed board 32 can be remarkably improved. Even if the distortion occurs, if the metal post 25 is longer, it can follow the distortion, and hence there does not occur any problem in the connection between the IC chip 10 and the printed board 32.

Sixth Embodiment

Figure 16A:
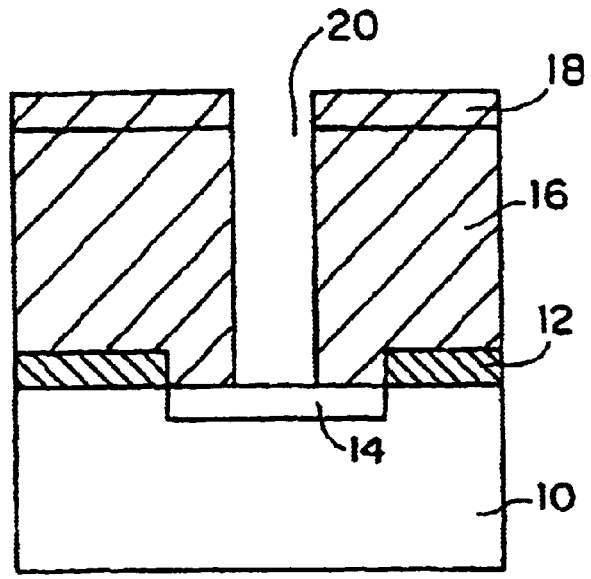
FIGS. 16A–16E and 17A–17B are views for explaining fabricating steps according to a sixth embodiment of the invention.
Figure 16B:
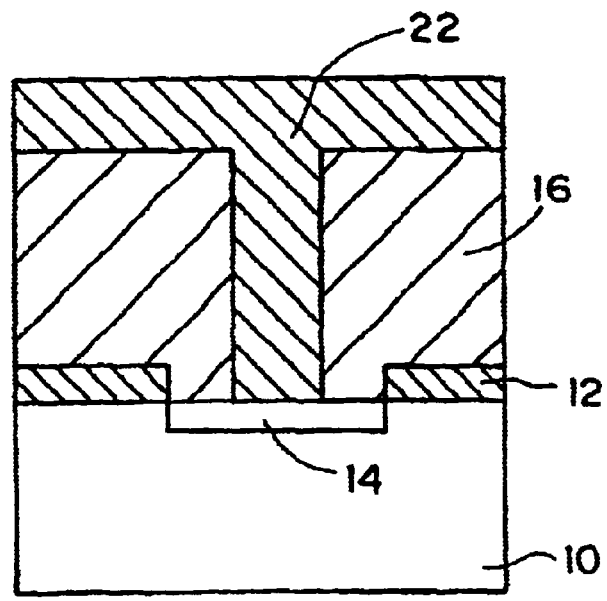
Figure 16C:
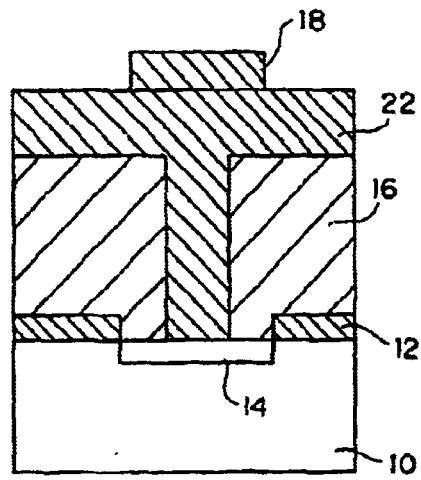
Figure 16D:
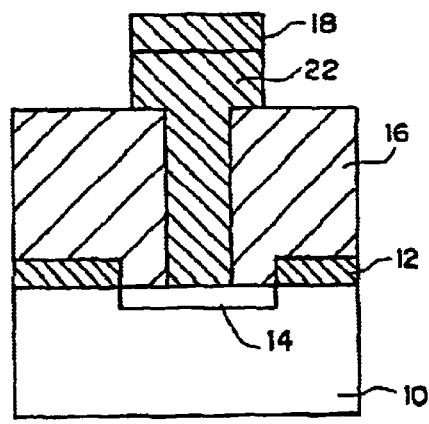
Figure 16E:
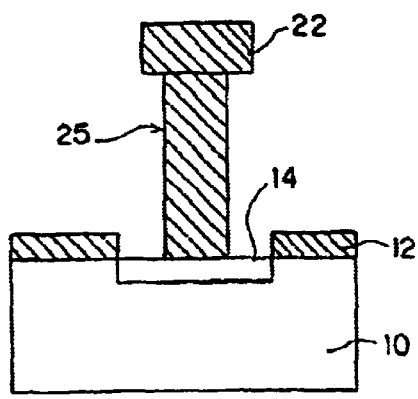

A six embodiment of the invention is a case where the tip end of a metal post 25 is made larger than the post part of the same. As shown in FIG. 16A, an electrode pad 14, a first insulating layer 12, and a second insulating layer 16 are formed on an IC chip 10, and a resist pattern 18 is formed on the second insulating layer 16, then the second insulating layer 16 is etched and removed to define an opening 20. Further, as shown in FIG. 16B, the first metal layer 22 is embedded in the opening 20 and formed on the surface of the second insulating layer 16. Subsequently, as shown in FIG. 16C and FIG. 16D, the resist pattern 18 is formed on the first metal layer 22 with a width larger than the width of the opening 20, then the first metal layer 22 is etched and removed while the resist pattern 18 serves as a mask. Finally, the second insulating layer 16 and the resist pattern 18 are removed as shown in FIG. 16E. In such a manner, the metal post 25 having the large tip end is formed.

Figure 17A:
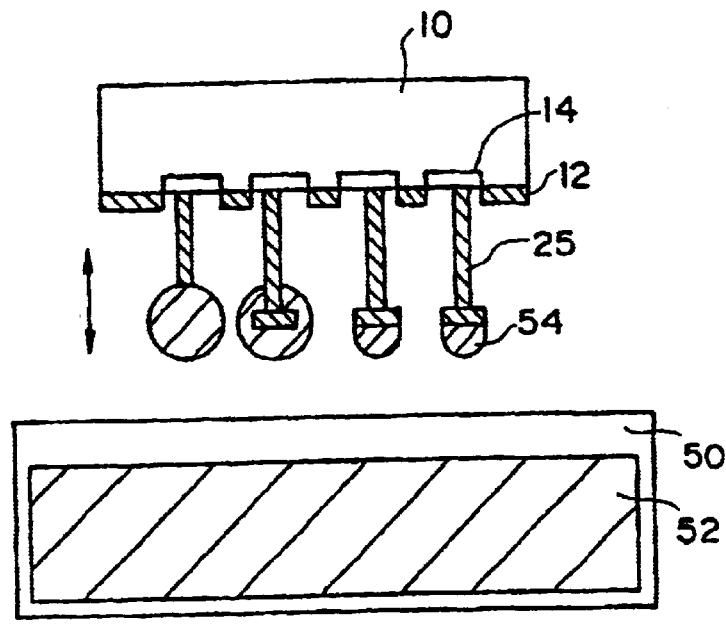
Figure 17B:
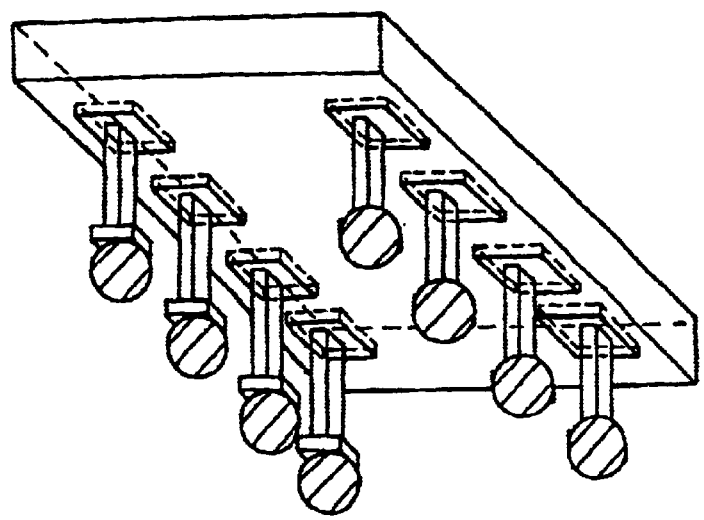
Figure 18A:
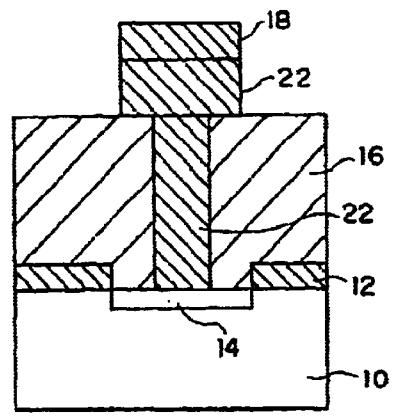
FIGS. 18A–18H are views for explaining fabricating steps according to a seventh embodiment of the invention.
Figure 18B:
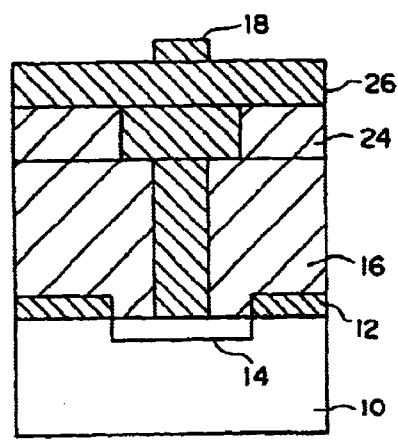
Figure 18C:
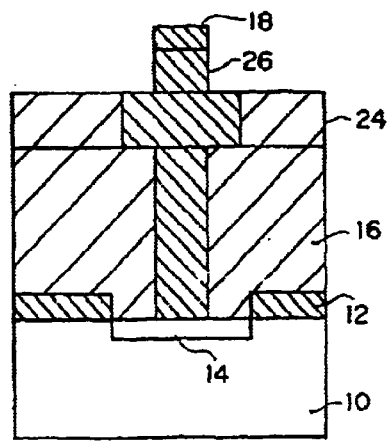
Figure 18D:
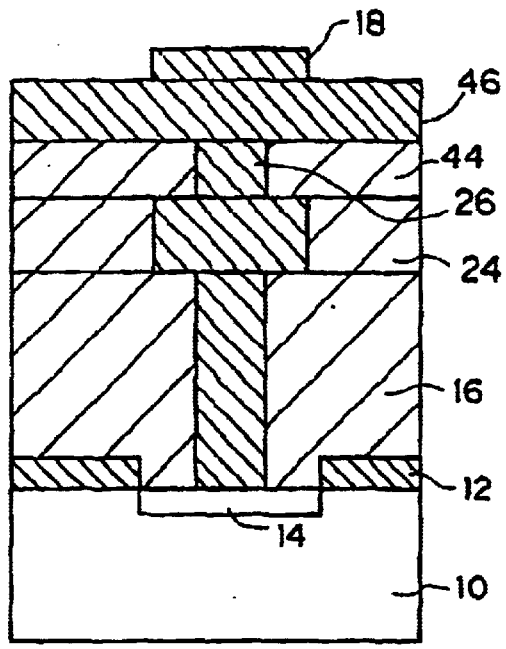
Figure 18E:
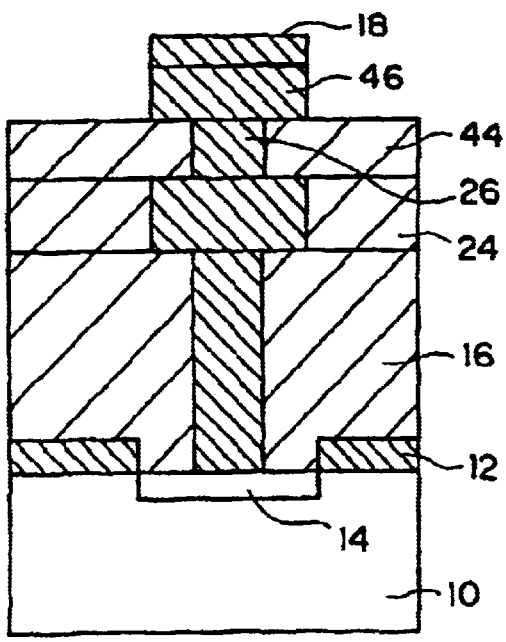
Figure 18F:
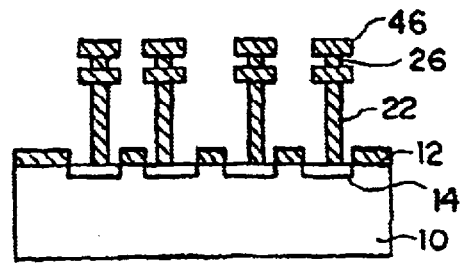
Figure 18G:
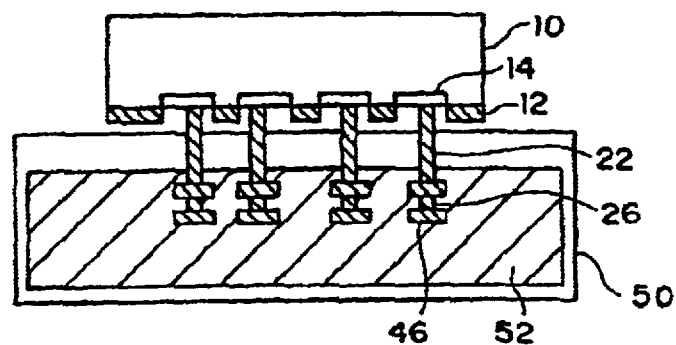
Figure 18H:
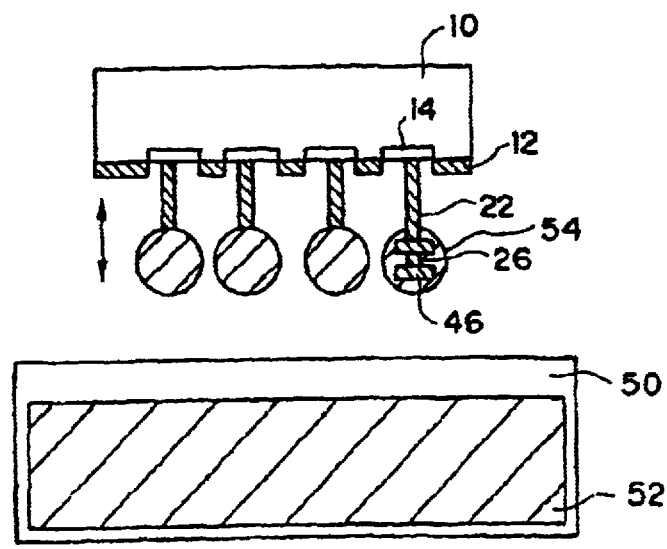
Figure 19A:
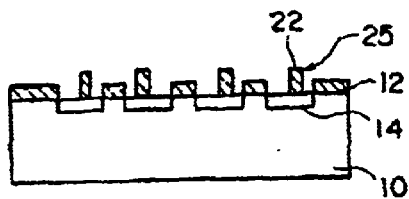
FIGS. 19A–19D are views for explaining fabricating steps according to an eighth embodiment of the invention.
Figure 19B:
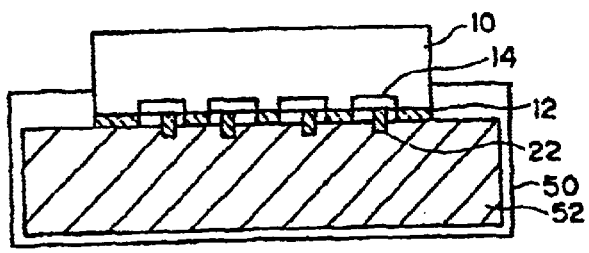
Figure 19C:
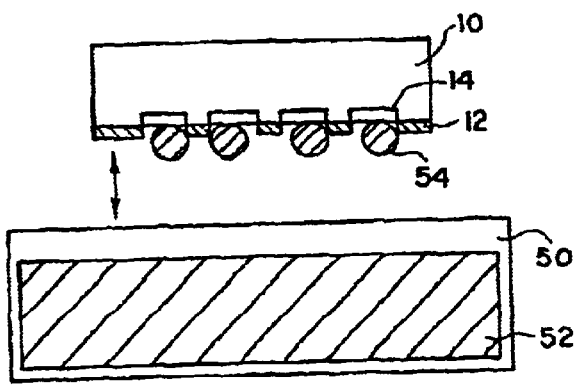
Figure 19D:
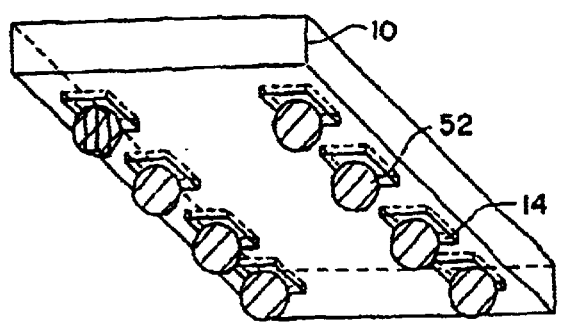
Figure 20A:
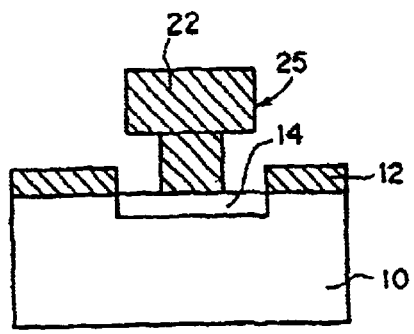
FIGS. 20A–20D are views for explaining fabricating steps according to a ninth embodiment of the invention.
Figure 20B:
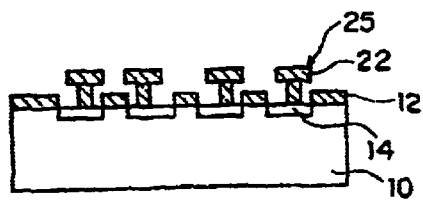
Figure 20C:
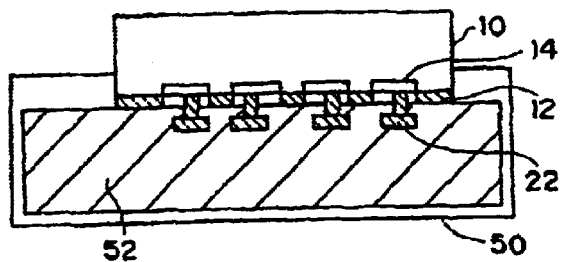
Figure 20D:
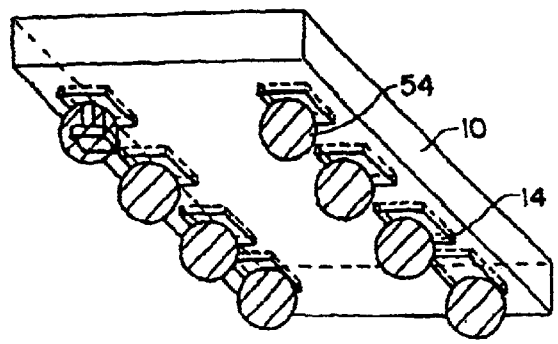

According to the sixth embodiment, the tip end of the metal post 25 is made larger than the post part, the portion of the tip end thereof which protrudes from or extends over the post part supports the molten solder liquid, and hence the solder can be bonded with ease. Further, since the tip end of the metal post 25 where the solder bump 54 of the metal post 25 is formed is made larger than the post part of the metal post 25, an area to contact the solder molten liquid increases. Further, as shown in FIG. 17A and FIG. 17B, the manner of bonding of the solder bump 54 is changed to be bonded only onto a T-shaped surface of the tip end of the metal post 25. The change of this bonding can be effected by applying flux on the surface of the tip end of the metal post 25.

Seventh Embodiment

A seventh embodiment of the invention is shown in FIG. 18. According to the seventh embodiment, a second metal layer 26 has a double structure in addition to the sixth embodiment. More in detail, as shown in FIG. 18, steps until forming the IC chip 10 are the same as the sixth embodiment (See FIG. 16D). Then, as shown in FIG. 18A, a resist pattern 18 on the IC chip 10 is removed, and as shown in FIG. 18B, a third insulating layer 24 and a second metal layer 26 are formed, then the resist pattern 18 is formed. Subsequently, as shown in FIG. 18C, the second metal layer 26 is etched and removed while the resist pattern 18 serves as a mask, then a fourth insulating layer 44, a third metal layer 46 are formed, and the resist pattern 18 is formed. Thereafter, as shown in FIG. 18E, the third metal layer 46 is etched and removed while the resist pattern 18 serves as a mask, then as shown in FIG. 18F, the fourth insulating layer 44 and the third metal layer 24 are etched and removed. Further, a solder bump 54 is formed while dipping a second metal layer 26 and the third metal layer 46 in a solder bath 50 in the same manner as the sixth embodiment (See FIG. 18G and FIG. 18H).

According to the seventh embodiment of the invention, with the foregoing double structure of the metal layers 26 and 46, a molten solder 52 enters between a space of the double structured parts, i.e. between the metal layers 26 and 46, and hence a surface tension occurs to the solder at the periphery thereof. Accordingly, the solder bump 54 can be formed with very ease.

Eighth Embodiment

With an en eighth embodiment, as shown in FIG. 19, the height of the metal post 25 formed on an electrode pad 14 of an IC chip 10 is rendered substantially the same as the height of a solder bump. Then, a metal post 25 is dipped in a molten solder 52 of a solder bath 50, thereby forming a solder bump. Concrete steps for fabricating the solder bump are the same as described in the sixth embodiment, and hence the explanation thereof is omitted.

According to the eighth embodiment, since the height of the metal post 25 is rendered substantially the same height of the solder bump, a contact area of the solder bump 54 increases by an area of a metal post 25 in addition to an area of the electrode pad 14, and hence the connection can be made more firm so that the connection efficiency is improved by the combination of the solder bump 54, the metal post 25 and the electrode pad 14. As a result, the stable solder bump 54 can be formed. In addition to that, the connection is further made firm because not only the increase of the contact surface but also the metal post 25 servings as a supporting post of the solder bump 54. The effect of the metal post 25 can be obtained not only after the formation of the solder bump 54 but also during the step of forming the solder bump 54. That is, in a case where the solder bump 54 is formed on the electrode pad 14 of the IC chip 10, the molten solder 52 contacts the metal post 25 owing to the presence of the metal post 25, so that the function of a surface tension occurs, and hence the solder bump 54 is formed with much ease and assurance.

Ninth Embodiment

Even with a ninth embodiment as shown in FIG. 20, the height of a metal post 25 formed on an electrode pad 14 of an IC chip 10 is rendered substantially the same as the height of a solder bump. Further, the tip end of the metal post 25 is made larger than the post part thereof. The size of the metal post 25 is not limited to a specific value, but a metal post 25 is not more than the size of the electrode pad 14 of the IC chip 10. Since the fabricating steps are the same as those in the sixth embodiment, the explanation thereof is omitted.

According to the ninth embodiment, the tip end of the metal post 25 is larger than the lower metal body, the holding capacity of the metal post 25 increases, so that the solder bump 54 can be formed with ease. In addition to that, since the height of the metal post 25 is substantially the same as that of the solder bump 54, the holding capacity of the molten solder liquid increases, and the solder bump 54 can be formed with ease. As a result, the solder bump 54 can be formed on the electrode pad 14 of the IC chip 10 with ease and high accuracy and assurance.

Tenth Embodiment

Figure 21A:
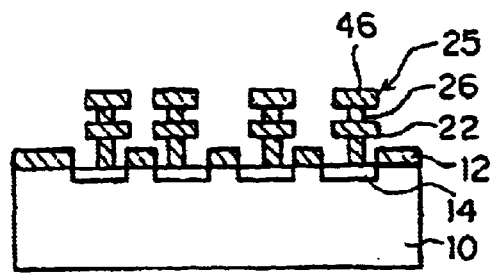
FIGS. 21A–21C and 22A–22D are views for explaining fabricating steps according to a tenth embodiment of the invention.
Figure 21B:
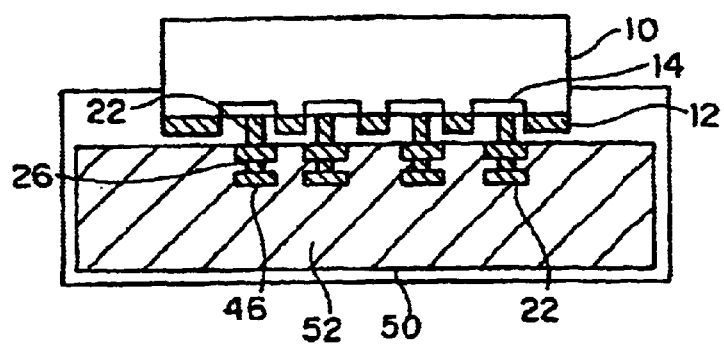
Figure 21C:
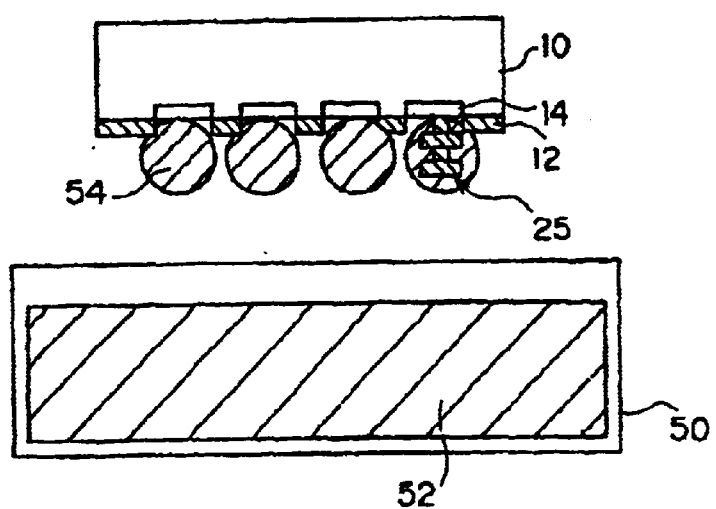
Figure 22A:
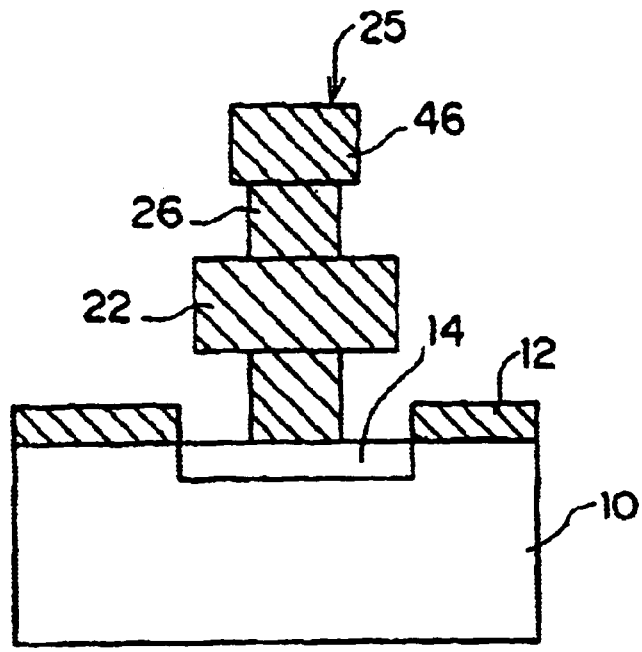
Figure 22B:
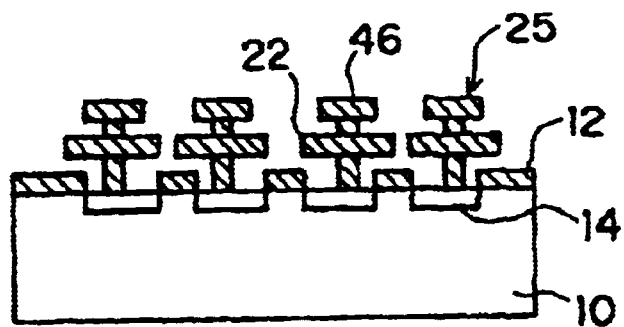
Figure 22C:
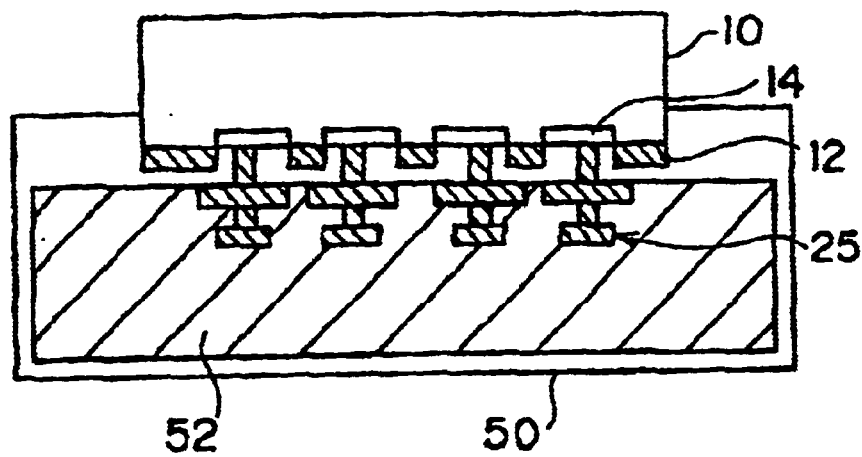
Figure 22D:
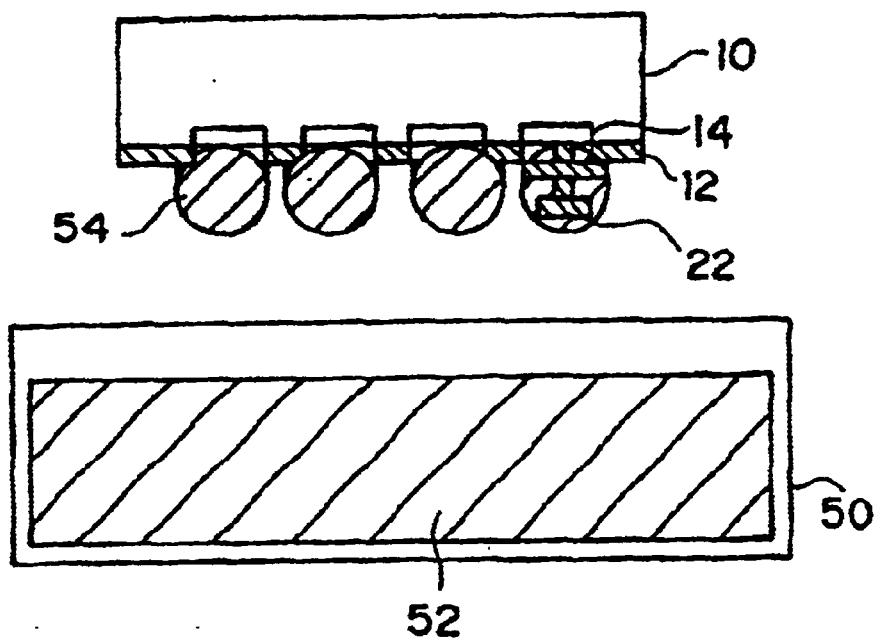

With a tenth embodiment of the invention as shown in FIG. 21, thee is provided a double structure formed of a first tip end portion and a second tip end portion formed on the first tip end portion in the same manner as the seventh embodiment. Further, the height of a metal post 25 is rendered substantially the same as that of a solder bump 54 in the same manner as the eighth and ninth embodiments of the invention. Since the fabricating steps are made the same as the seventh embodiment, the explanation thereof is omitted.

According to the tenth embodiment, since the tip end of the metal post 25 is larger than the post part thereof, the holding capacity of the solder bump 54 increases, thereby forming the solder bump 54 with ease. In addition to that, since the height of the metal post 25 is rendered substantially the same as that of the solder bump 54, surface tension occurs to the tip end of the molten solder 52, thereby forming the solder bump 54 with ease. As a result, the solder bump 54 can be simply formed on the electrode pad 14 of the IC chip 10 with high accuracy and assurance.

According to the tenth embodiment, although the tip end of the metal post 25 has a double structure having the same size, the metal post 25 may have the construction as shown in FIG. 22, in which a third metal layer 46 is smaller than the first metal layer 22 formed immediately thereunder, namely, a double structure having the different size of construction at the tip end. Since the fabricating steps are the same as the sixth embodiment, an explanation thereof is omitted. Although the third metal layer 46 is not limited to a specific size, it is normally not smaller than the first metal layer 22. Further, although the thickness of the first metal layer 22 is not limited to a specific value, it can be appropriately increased or decreased depending on the height of the metal post 25.

With the double structure having the different size, the surface area increases so that the solder bump 54 is prone to be attached. Further, since the first metal layer 22 is larger than the third metal layer 46, solder is bonded only to the third metal layer 46, the second metal layer 26 and the first metal layer 22, and it is not bonded to other portions where solder is not needed, namely, to the IC chip 10.

Further, the solder bump can be formed by selecting the size thereof, and in this case, it can be made small on the third metal layer 46 and the second metal layer 26. In a case where the solder bump 54 including the third metal layer 46, the second metal layer 26 and the first metal layer 22 is formed, the solder bump 54 can be formed stably.

Eleventh Embodiment

Figure 23A:
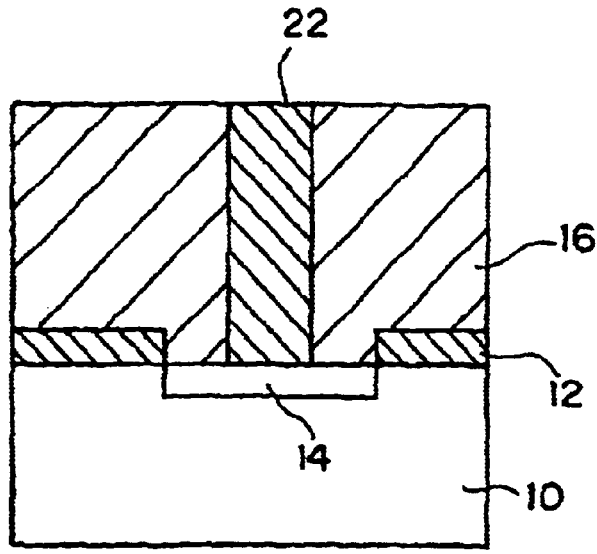
FIGS. 23A–23D are views for explaining fabricating steps according to an eleventh embodiment of the invention.
Figure 23B:
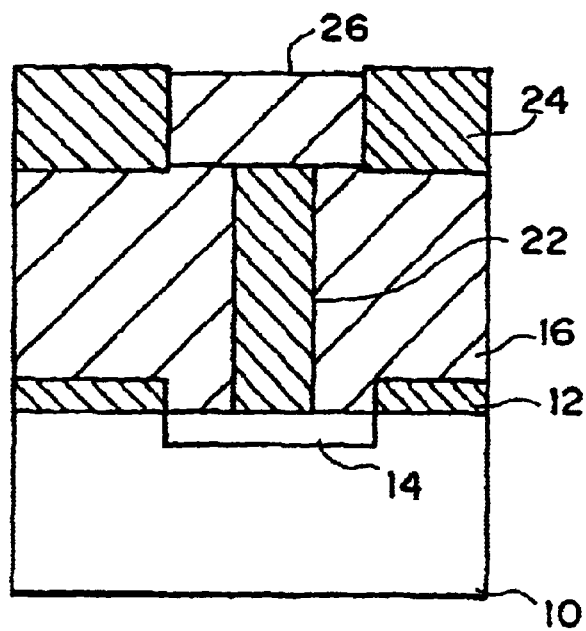

An electrode pad 14, a first insulating layer 12, a second insulating layer 16, and a first metal layer 22 are formed on an IC chip 10 shown in FIG. 23A in the same manner as the IC chip 10 of the first embodiment of the invention (See FIG. 1E). Then, a third insulating layer 24 is formed on the IC chip 10 as shown in FIG. 23B.

Figure 23C:
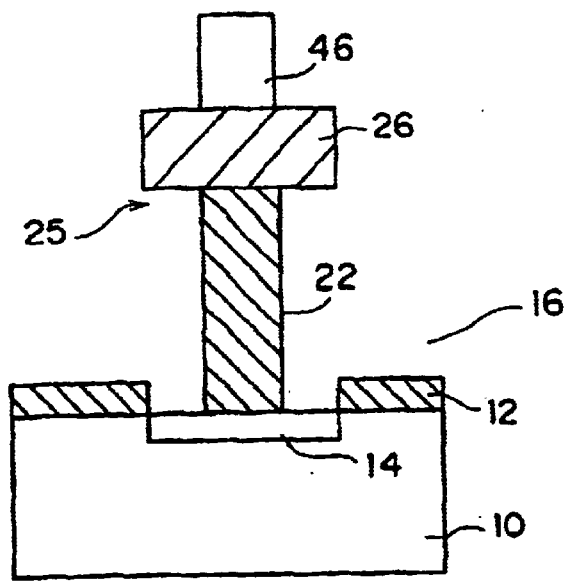

The third insulating layer 24 may be made of either the same material as or different material from the second insulating layer 16. Next, the third insulating layer 24 is bored to define an opening in which a second metal layer 26 is formed. When boring the opening, the opening has to be larger than the first metal layer 22. Subsequently, as shown in FIG. 23C, a third insulating layer (not shown) is formed over the opening, and the third insulating layer is bored to have an opening which area is smaller than that of the second metal layer 26.

A third metal layer 46 is formed in the opening and the second insulating layer 16 and the third insulating layer 24 are etched and removed. However, the second insulating layer 16 may be left as it is, if necessary. The third metal layer 46 is made of a solder material. Accordingly, the third metal layer 46 serves as a solder bump. For the third metal layer 46, it can employ a metal body or conductor (including an organic conductor) having a nature to connect between a metal with other metal or metals of the same kind in addition to a solder material.

With the foregoing steps, the first metal layer 22 and a metal post 25 comprising the second metal layer 26 and the third metal layer 46 are formed on the electrode pad 14 of the IC chip 10.

Figure 23D:
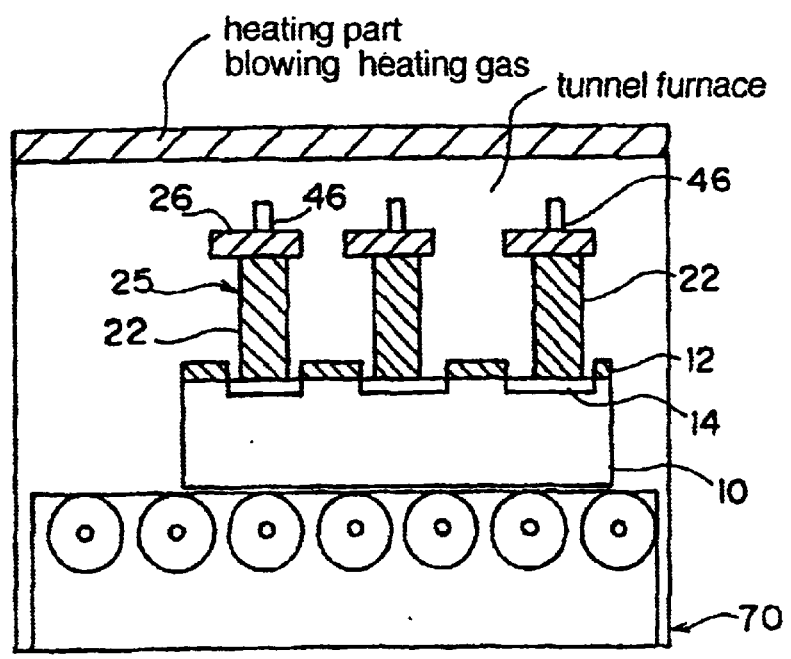

As shown in FIG. 23D, there is a case where the third metal layer 46 is bonded to the first metal layer 22 with stability by heating the IC chip 10 by a heating apparatus 70. The step may be eliminated and the IC chip 10 may be heated when connecting to the printed board.

According to the eleventh embodiment of the invention, since an IC fabricating technique is employed as a method of forming the third metal layer 46, namely, solder bump, the solder bump can be more microfabricated so that the solder bump can be fabricated with stability and high accuracy.

Twelfth Embodiment

With the foregoing embodiments as set forth above, the shape of a metal post 25 formed on the electrode pad 14 of the IC chip 10 is perpendicular to the IC chip 10. However, a metal layer formed according to the twelfth embodiment is a bent crank-like shape.

Figure 24A:
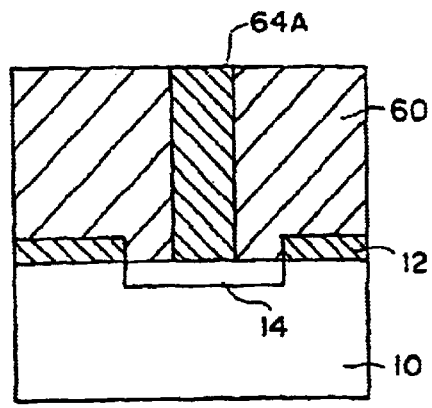
FIGS. 24A–24G are views for explaining fabricating steps according to an eleventh embodiment of the invention.
Figure 24B:
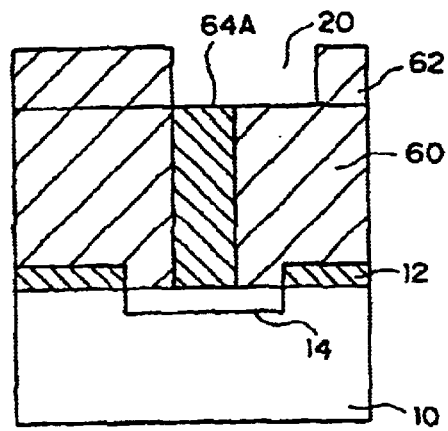

An electrode pad 14, a first insulating layer 12, a first photosensitive material layer 60, and a seal member layer 64A are formed on an IC chip 10 shown in FIG. 24A in the same manner as the IC chip 10 of the first embodiment of the invention (See FIG. 1E). Then, as shown in FIG. 24B, the second photosensitive material layer 62 is formed and an opening including the seal member layer 64A is formed in the second photosensitive material layer 62 and the opening is stretched in a horizontal direction.

Figure 24C:
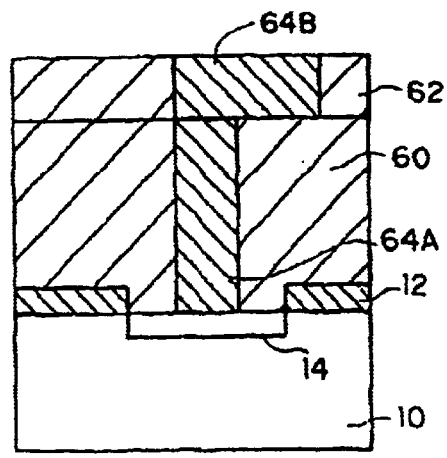
Figure 24D:
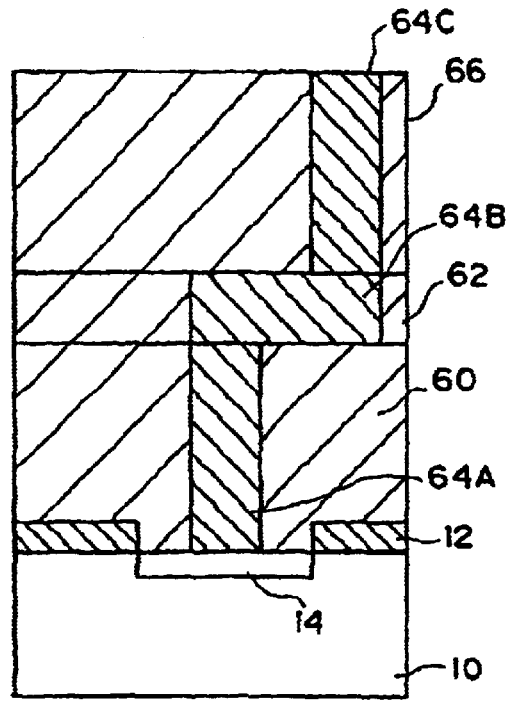

As shown in FIG. 24C, a sealing material layer 64B is filled in the opening 20. Likewise, as shown in FIG. 24D, a third photosensitive material layer 66 is formed, then an opening is defined. The opening is formed in a position extended in the vertical direction of the opening as shown in FIG. 24D. The sealing member layer 64C is filled in the opening.

Figure 24E:
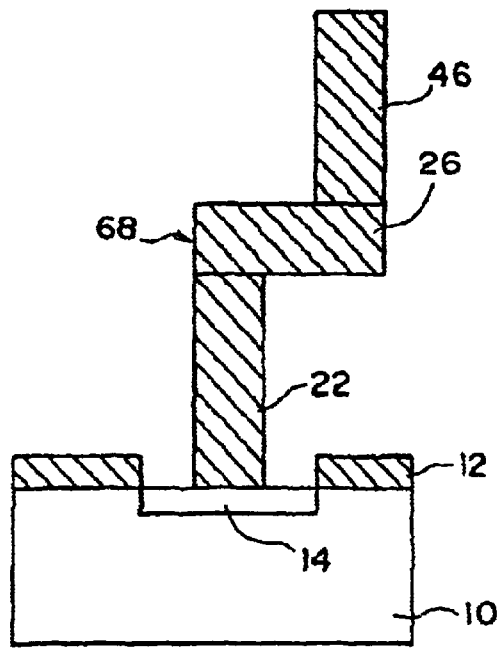

Thereafter, the sealing member layers 64A, 64B, 64C are etched and removed. When the sealing member layers 64A, 64B, 64C are removed, a crank-shaped hollow portions are formed on the IC chip 10. The first metal layer 22, the second metal layer 26, and the third metal layer 46 are filled in the hollow portion. Thereafter, the third photosensitive material layer 66, the second photosensitive material layer 62 and first photosensitive material layer 60 are etched and removed. With the foregoing steps, a crank-shaped metal post 68 is formed on the electrode pad 14 of the IC chip 10 as shown in FIG. 24E. Subsequently, a solder bump is formed on the tip end of a metal body 68.

Figure 24F:
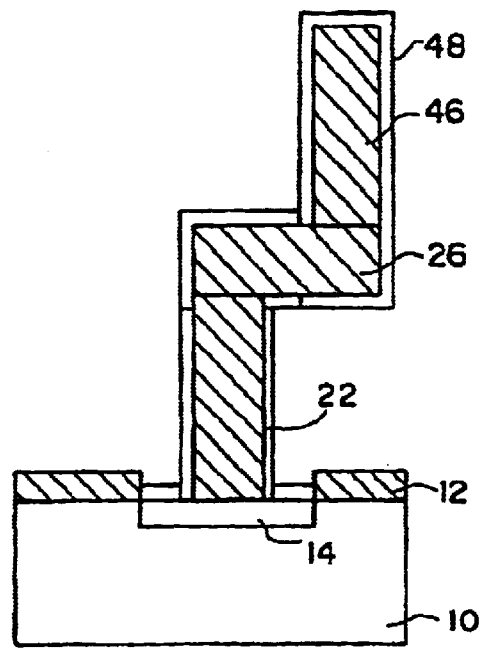
Figure 24G:
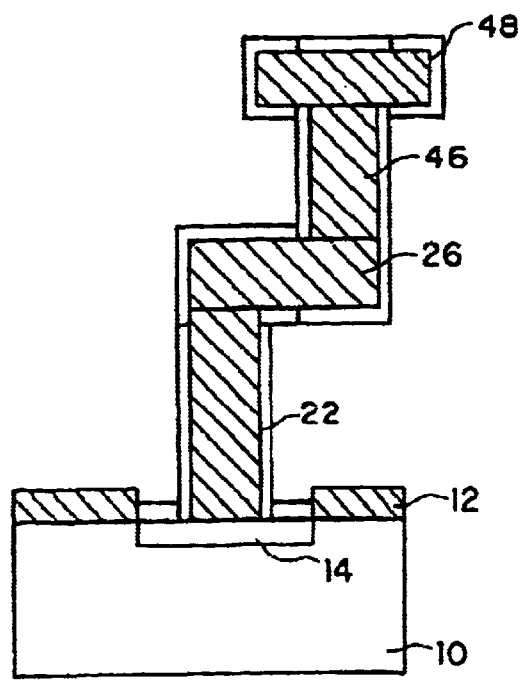

The metal body 68 may be formed of a single metal body, if necessary, and may be a composite body of the third metal layer 46, or a fourth metal body 48 (See FIG. 24F, FIG. 24G).

For the variations of the tip end or base end of the metal body 68, they may have the shapes as explained with reference to the foregoing embodiments.

Thirteenth Embodiment

With the foregoing embodiments, although the electrode pad 14 of the IC chip 10 is formed on the periphery of the active region of the IC, it is disposed inside the active region of the IC according to the thirteenth embodiment of the invention.

Figure 25A:
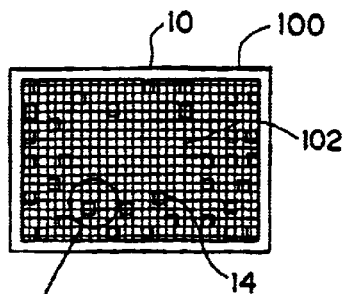
FIGS. 25A–25C are views for explaining the construction according to a thirteenth embodiment of the invention.

More in detail, as shown in FIG. 25A, a scribe region 100 is formed on the outermost side of the IC chip 10, and an IC active region 102 is formed inside the scribe region 100. Accordingly, although a group of electrode pads has not been conventionally disposed in a region adjacent to the inner side of the scribing region 100, the group of electrode pads is not disposed in this region and the electrode pad 14 is formed in the IC active region 102. The size of the electrode pad 14 can be made extremely small. The size of the electrode pad 14 is typically 1 $\mu$m to several ten $\mu$m but it may be not more than sub $\mu$m.

Figure 25B:
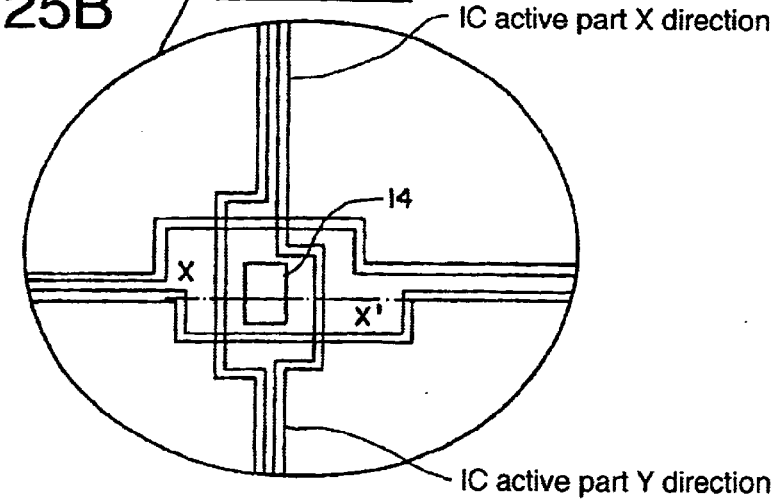
Figure 25C:
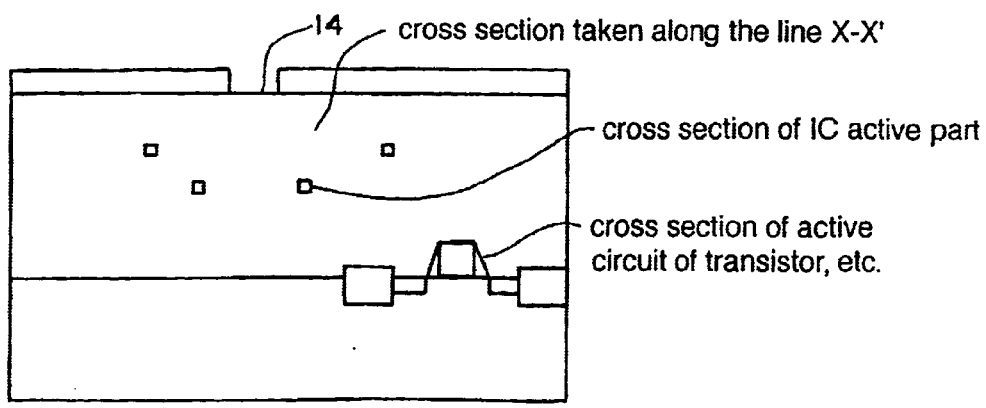

An enlarged view of the electrode pad 14 is shown in FIG. 25B. The IC active region 102 is formed by avoiding the electrode pad 14. However, it is not always necessary to avoid the electrode pad 14. A cross section taken along the line X–X' traversing the region of the electrode pad 14 is shown in FIG. 25C. The IC active region 102 is not formed on the lower layer of the electrode pad 14. Metal posts 25, 68 as described with reference to the foregoing embodiments can be formed on the electrode pad 14. A method of connecting between the IC chip 10 and the electrode pad 36 of the printed board 32 is the same as the method mentioned above, and hence the explanation thereof is omitted.

According to the thirteenth embodiment of the invention, the electrode pad 14 per se can be made small, and since the electrode pad 14 is formed inside the IC active region 102, an area of the IC chip 10 can be made extremely small. That is, the area of the electrode pad 14 can be rendered substantially the same as the area of the IC active region 102, and the electrode pad 14 need not be formed in an area adjacent to the inner side of a scribing area 100, and hence this area can be eliminated. Accordingly, the area of the IC chip 10 can be reduced.

Further, the electrode pad can be disposed in the region of the IC active part. Further, when the metal post is formed on the electrode pad, the wiring need not be drawn around, and hence a mutual interference caused by a wiring in high frequency can be remarkably reduced.

Fourteenth Embodiment

With a fourteenth embodiment, there is described a method of probing and measuring electric characteristics using a metal post 25 formed on the electrode pad 14 of the IC chip 10, as explained in the foregoing embodiments.

Figure 26A:
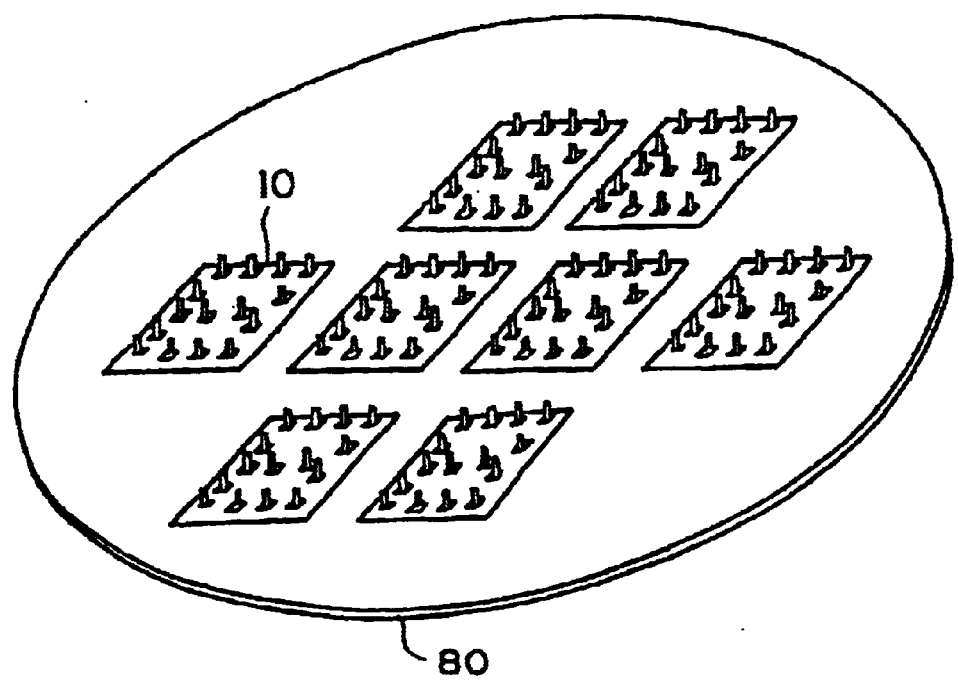
FIGS. 26A–26B and 27A–27I are views for explaining procedures to probe and measure the semiconductor IC board fabricated according to the embodiments of the invention.
Figure 26B:
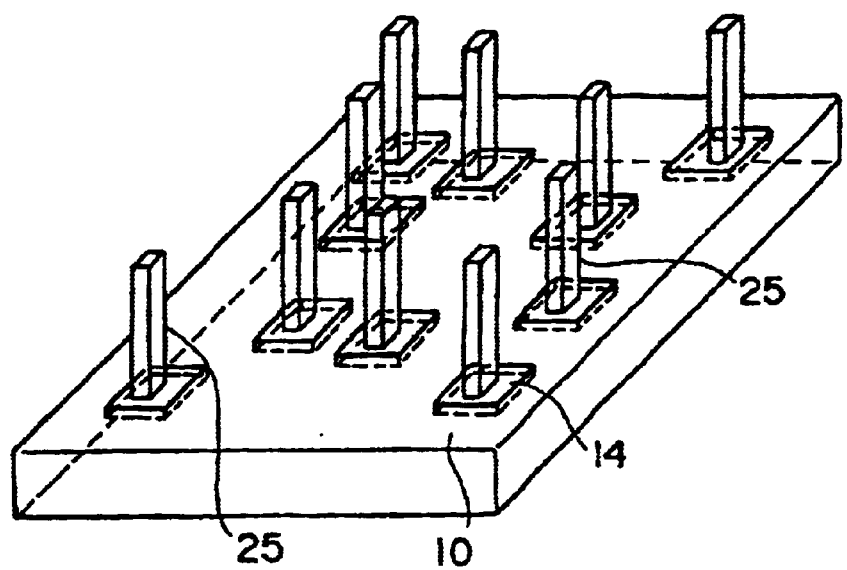

As shown in FIG. 26A, a plurality of IC boards (chips) 10 are formed on a wafer 80, and an electrode pad 14 is formed on one IC chip 10 on the wafer 80 as shown in FIG. 26B, and a metal post 25 is formed on the electrode pad 14.

Figure 27A:
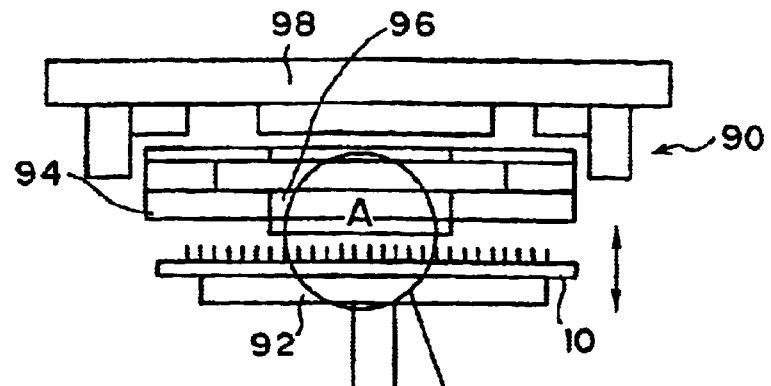

As shown in FIG. 27A, a probe device 90 according to fourteenth embodiment is not provided with an in-depth probe but provided with a flat probe mechanism comprising a flat electrode instead of the in-depth probe. The flat probe mechanism comprises a flat probe head 94, a flat probe electrode 96 and a probe control mechanism 98 each serving as a scheme of the probe device 90. For a material of the flat probe electrode 96, there is employed metal, conductive resin, conductive plastics and the like. Particularly, in the case of the conductive resin or conductive plastics, they are desirable because of a large buffer action when contacting a metal post of an IC.

Figure 27B:
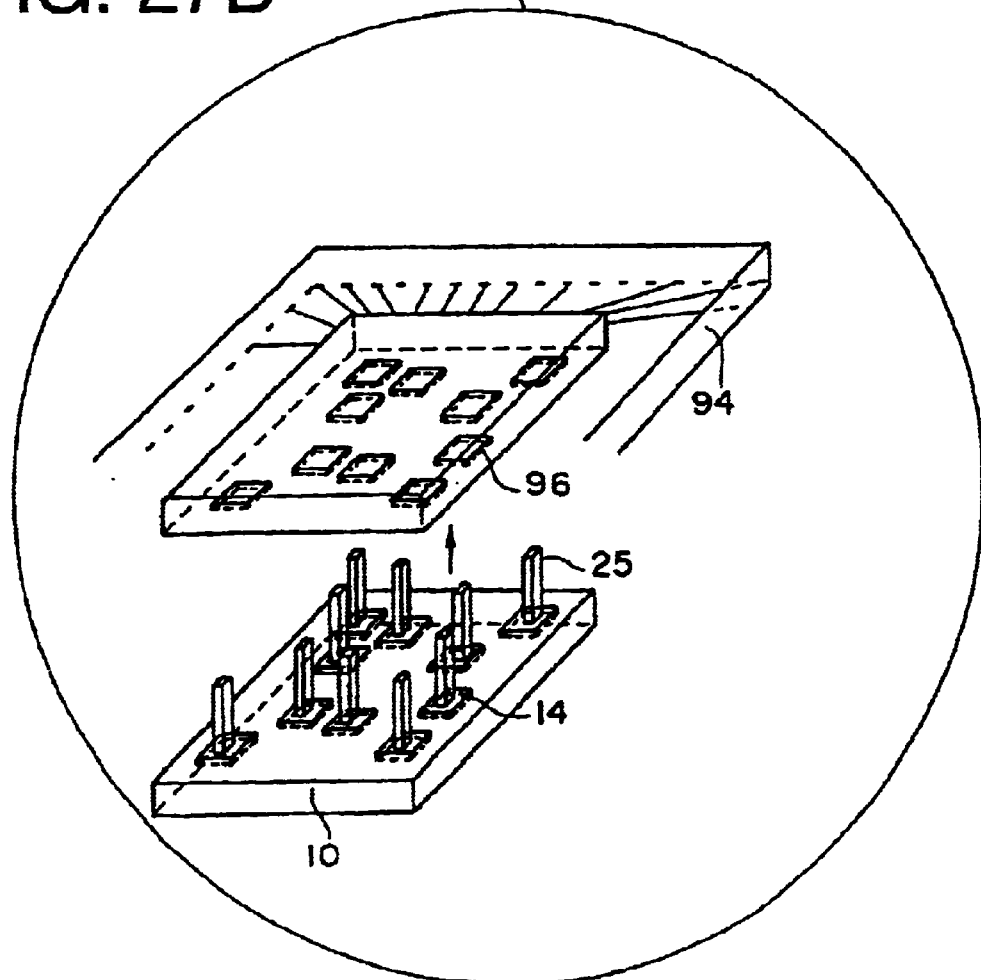

The flat probe electrode 96 may have a metal projection. In this case, the projection can contact the metal post 25 of the IC chip 10 with assurance. When effecting probing, the wafer 80 is placed on a wafer mounting table 92 of the probe device 90. As shown in FIG. 27B, the wafer 80 is raised until it reaches the flat probe electrode 96 of the probe device 90 so that the flat probe electrode 96 and the metal post 25 on the wafer 90 are brought into contact with each other, thereby effecting probing. Further, the flat probe electrode 96 may be structured to descend.

According to the fourteenth embodiment, since the probe device 90 has the flat probe electrode 96, when the flat probe electrode 96 is brought into contact with the metal post 25 on the IC chip 10, probing can be effected. Accordingly, an in-depth probe need not be provided on the probe device 90, and the metal post 25 serves as the in-depth probe. As a result, the metal post 25 formed on the electrode pad 14 of the IC chip 10 can always keep a fresh surface.

Further, since the contact area between the metal post 25 and the flat probe electrode 96 of the probe device 90 is small, even if a foreign matter is attached to the metal post 25, contamination of the flat probe electrode 96 by the foreign matter is extremely small, thereby effecting stable probing.

Further, the flat probe electrode 96 is fabricated in the following steps.

Figure 27C:
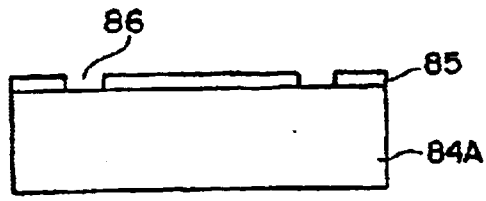
Figure 27D:
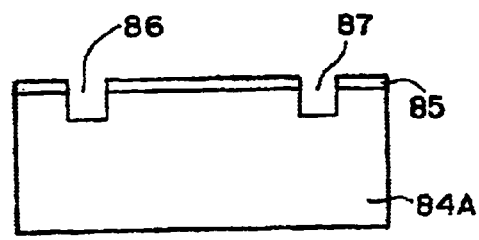

As shown in FIG. 27C and FIG. 27D, an insulating layer 85 is formed on a first temporary board 84A by a CVD or sputtering technique. Although it is preferable that the first temporary board 84A is formed of a silicon semiconductor board, it may be formed of other boards such as quartz board and the like. A thickness of insulating layer 85 is preferable to range from 0.5 $\mu$m to 1.5 $\mu$m.

Subsequently as shown in FIG. 27C, a resist pattern (not shown) is formed on the insulating layer 85, and the insulating layer 85 is etched and removed, thereby forming an opening 87.

Figure 27E:
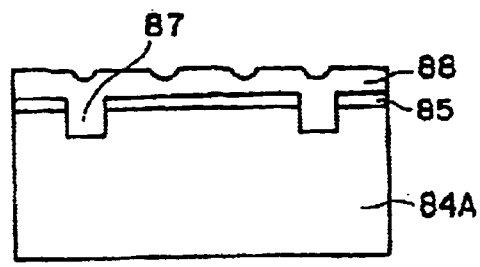
Figure 27F:
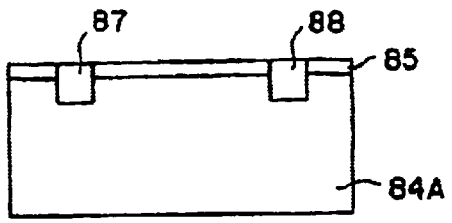

Further as shown in FIG. 27D, a groove is formed on the first temporary board 84A while the insulating layer 85 serves as a mask. Thereafter as shown in FIG. 27E, a conductive material layer 88 is deposited on the first temporary board 84A by a sputtering technique and the like, then as shown in FIG. 27F, the surface of the first temporary board 84A is polished by a CMP technique and the like. In such a manner, the conductive material layer 88 is embedded in the opening 87.

Figure 27G:
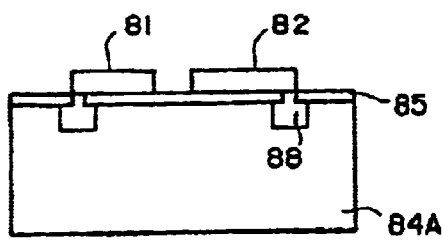
Figure 27H:
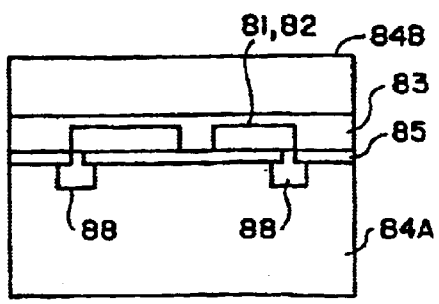
Figure 27I:
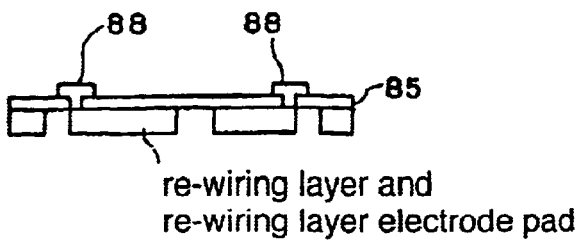

Then, as shown in FIG. 27G, re-wiring layer 81 and a re-wiring layer electrode 82 are formed. Subsequently, as shown in FIG. 27H, a second temporary board 84B is stuck onto the re-wiring layer electrode 82 using a resin adhesive 83, thereafter the first temporary board 84A is removed to expose the conductive material layer 88, then as shown in FIG. 27I, the second temporary board 84B is removed. With the foregoing steps, the flat probe electrode 96 is fabricated.

Figure 28A:
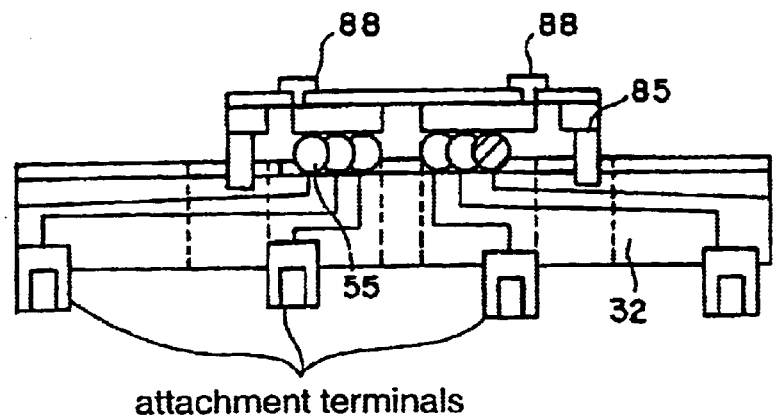
FIGS. 28A–28B are views for explaining steps of fabricating a probe electrode in a probing apparatus for use in the probing and measurement.

Next, as shown in FIG. 28A, the flat probe electrode 96 is mounted on the printed board 32 to fabricate a probe card provided with the flat probe electrode 96 (See FIG. 27). The side of the flat probe electrode 96 where the re-wiring layer 81 of the flat probe electrode 96 is formed is confronted with the printed board 32 (See FIG. 27). Solder balls 55 are formed on the re-wiring layer 81.

Figure 28B:
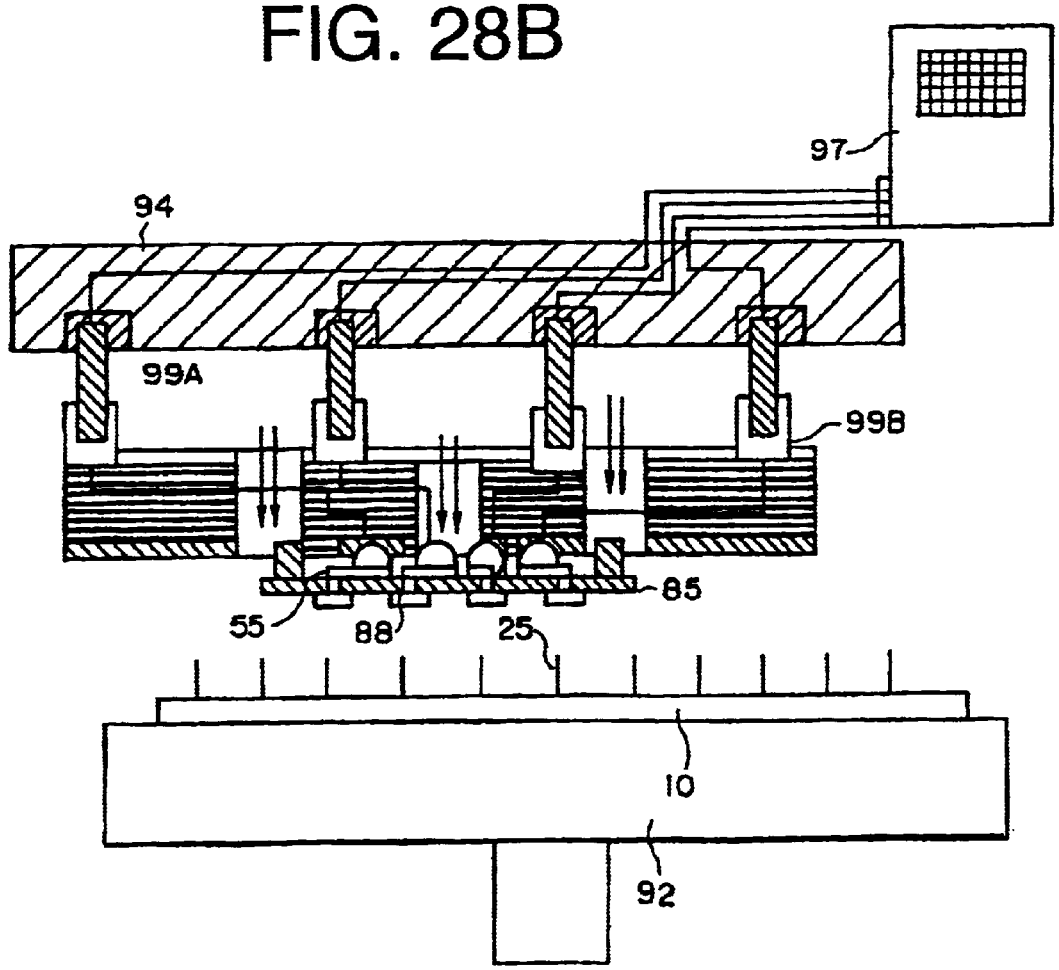
Figure 29A:
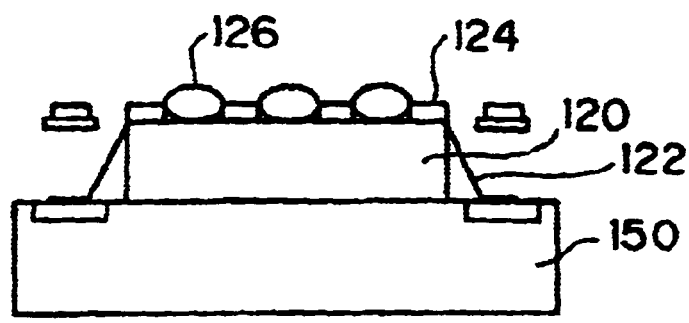
FIGS. 29A–29E are views for explaining prior arts.
Figure 29B:
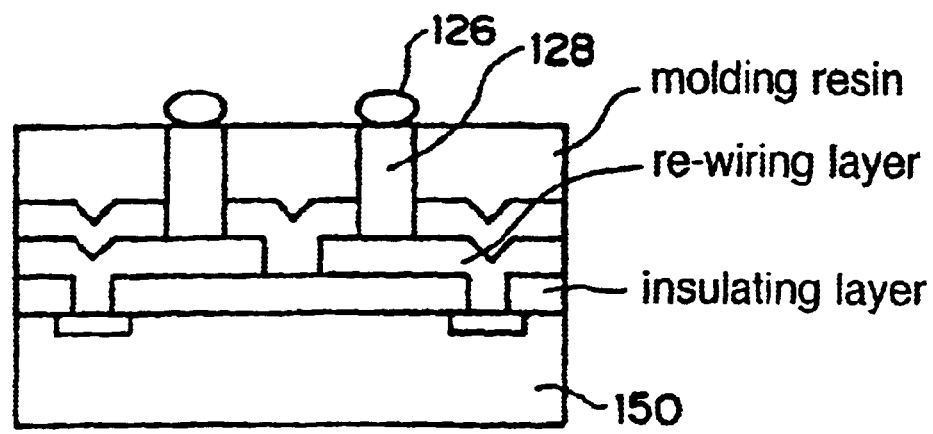
Figure 29C:
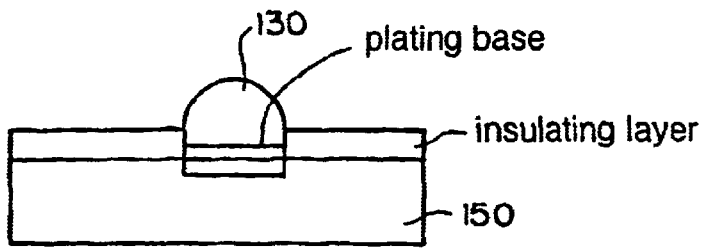
Figure 29D:
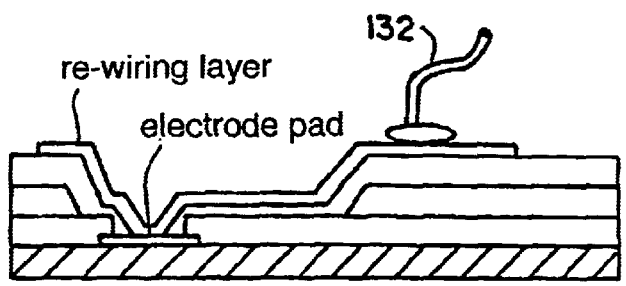
Figure 29E:
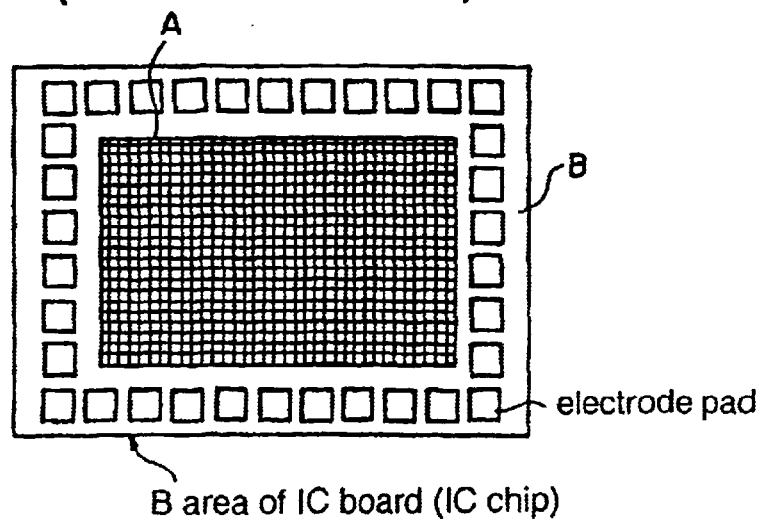

FIG. 28B shows a probe using a probe card provided with the flat probe electrode 96. The wafer mounting table 92 is provided on the lower portion of the flat probe electrode 96, and the probe device 90 is mounted on the wafer mounting table 92. The metal post 25 is formed on the electrode pad 14 of the IC chip 10 over the probe device 90, wherein when the wafer mounting table 92 is raised, the wafer 80 contacts the flat probe electrode 96 so that a current flows to a measuring device 97 via attachment terminals 99A, 99B, thereby effecting probing.

The size and layout of the electrode pad of the flat probe electrode 96 is formed by subjecting those similar to the size and layout of a probing electrode pad formed on the IC chip 10 to an IC forming technique such as photolithographic and etching techniques. As a result, it is possible to digitally effect the alignment in order to contact between the electrode pad 14 of the IC chip 10 and the flat probe electrode pat of the probe. This is effected because the electrode pad 14 of the IC chip 10 and the electrode pad of the probing device have the same design pattern (however there is mirror image relation).

For a material of the flat probe electrode of the probing device, it is possible to employ an electric conductor comprising a single or compound material of metals such as aluminum, Au (gold), copper, titanium and the like. Further, in addition to these metals, it is possible to employ electric conductor comprising plastics, resins, or compound material or mixed material formed of plastics, resins and metals each having electric conductivity or anisotropic electric conductivity. It is also possible to employ a material which exhibits electric conductivity by pressurization such as a compound material or a mixed material formed of plastics, resins and metals.

According to the fourteenth embodiment of the invention, since with the construction of the probe device 90, a conventional in-depth probe is replaced by the flat probe electrode 96 and the layout and construction of the flat probe electrode 96 are substantially rendered the same as the layout of the electrode pad 14 of the IC chip 10, so that the metal post 25 of the electrode pad 14 on the IC chip 10 and the flat probe electrode 96 of the probe device 90 can be aligned with each other by only superimposing the same patterns over each other to align them, which can be very simply effected. Further, since an electric conducting wire between the IC chip 10 and the probe device 90 can be made very short, electric characteristics in a high frequency can be correctly measured.

As mentioned in detail above, there is an advantage that an electrode pad can be microfabricated, resulting in the achieving microfabrication of an IC board.

What is claimed is:

1. A method of fabricating an IC chip comprising:

laminating a first insulating layer on a board;

forming an electrode pad on the board, the electrode pad serving as an input/output terminal;

laminating a second insulating layer over the board and the electrode pad;

forming a resist pattern on the second insulating layer at a region other than a part of the electrode pad;

etching and removing the second insulating layer using the first resist pattern as a mask, thereby defining a first opening in the second insulating layer on the electrode pad;

filling the opening with a conductive material layer made of a conductive material;

laminating a third insulating layer over the second insulating layer and the conductive material layer;

forming a second resist pattern on the third insulating layer at a region other than a region of the conductive material layer;

etching and removing the third insulating layer using the second resist pattern as a mask, thereby defining a second opening in the third insulating layer at the region of the conductive material layer;

filling the second opening with a metal layer made of an electric connection material;

etching and removing the third insulating layer and the second insulating layer after said filling the second opening; and forming a filling insulating material on the first insulating layer and the electrode pad after said etching and removing the third insulating layer and the second insulating layer, to surround sidewalls of the conductive material layer and the metal layer.

2. The method of fabricating an IC chip according to claim 1, wherein the electric connection material is molten solder.

3. The method of fabricating an IC chip according to claim 1, wherein the second resist pattern is formed so that the metal layer filled in the second opening is wider than the conductive material layer filled in the first opening.

4. The method of fabricating an IC chip according to claim 1, wherein the second resist pattern is formed so that the metal layer filled in the second opening is narrower than the conductive material filled in the first opening.

5. The method of fabricating an IC chip according to claim 1, wherein the second resist pattern is formed so that a width of the metal layer filled in the second opening is substantially the same as a width of the conductive material layer in the first opening.

6. The method of fabricating an IC chip according to claim 1, further comprising:

placing the board over a printed board after said etching and removing the third insulating layer and the second insulating layer, the electrode pad being aligned with a pad formed on the printed board; and heating the electric connection material to electrically connect the electrode pad with the pad formed on the printed board.

7. The method of fabricating an IC chip according to claim 6, wherein the electric connection material is solder.

* * * * *